United States Patent [19]

Owada et al.

[11] Patent Number: 5,089,430
[45] Date of Patent: Feb. 18, 1992

[54] METHOD OF MANUFACTURING SEMICONDUCTOR INTEGRATED CIRCUIT BIPOLAR TRANSISTOR DEVICE

[75] Inventors: Nobuo Owada, Ohme; Hizuru Uda, Fussa, both of Japan

[73] Assignee: Hitachi, Ltd., Tokyo, Japan

[21] Appl. No.: 509,223

[22] Filed: Apr. 16, 1990

[30] Foreign Application Priority Data

Apr. 21, 1989 [JP] Japan .................. 1-101943

[51] Int. Cl.⁵ .......................................... H01L 21/328
[52] U.S. Cl. ................................. 437/31; 437/162; 437/193; 437/90; 148/DIG. 26
[58] Field of Search .......... 437/31, 32, 33, 161, 437/162, 193, 90; 357/34; 148/DIG. 26

[56] References Cited

U.S. PATENT DOCUMENTS

| | | | |
|---|---|---|---|
| 3,912,557 | 10/1975 | Hochberg | 148/DIG. 26 |
| 4,545,114 | 10/1985 | Ito et al. | 437/31 |
| 4,663,831 | 5/1987 | Birrittella et al. | 437/193 |
| 4,729,965 | 3/1988 | Tamaki et al. | 437/31 |
| 4,746,629 | 5/1988 | Hanagasaki | 437/162 |
| 4,751,195 | 6/1988 | Kawai | 437/31 |
| 4,771,328 | 9/1988 | Malaviya et al. | 357/34 |
| 4,782,030 | 11/1988 | Katsumata et al. | 437/33 |
| 4,818,713 | 4/1989 | Feygenson | 437/31 |
| 4,851,362 | 7/1989 | Suzuki | 437/31 |
| 4,974,045 | 11/1990 | Okita | 357/34 |

FOREIGN PATENT DOCUMENTS

| | | | |
|---|---|---|---|
| 0350610 | 1/1990 | European Pat. Off. | 437/31 |
| 58-89863 | 5/1983 | Japan | 437/31 |
| 61-271871 | 12/1986 | Japan | 437/31 |
| 63-78569 | 4/1988 | Japan | 437/31 |
| 1-155660 | 6/1989 | Japan | 437/31 |

OTHER PUBLICATIONS

"Nikkei Microdevices", Nov. 1985, pp. 67-78.
"A Self-Aligned Bipolar Transistor . . . ", Research Disclosure, Apr. 1989, 30062, p. 276.
Wolf et al., Silicon Processing, Lattice Press, 1986, pp. 175-182.

Primary Examiner—Brian E. Hearn
Assistant Examiner—T. N. Quach
Attorney, Agent, or Firm—Fay, Sharpe, Beall, Fagan, Minnich & McKee

[57] ABSTRACT

A method of manufacturing a bipolar transistor having a base lead-out electrode provided so as to surround an emitter region to be formed on a main surface of a semiconductor substrate and also having an emitter lead-out electrode provided along a stepped shape of the base lead-out electrode and connected to said emitter region is characterized by forming a first silicon film selectively only in an area surrounded by the base lead-out electrode. Impurity is introduced into the first silicon film and then diffused into the main surface of the semiconductor substrate to form the emitter region. Finally, a second silicon film is formed on the first silicon film to serve as the emitter lead-out electrode.

41 Claims, 15 Drawing Sheets

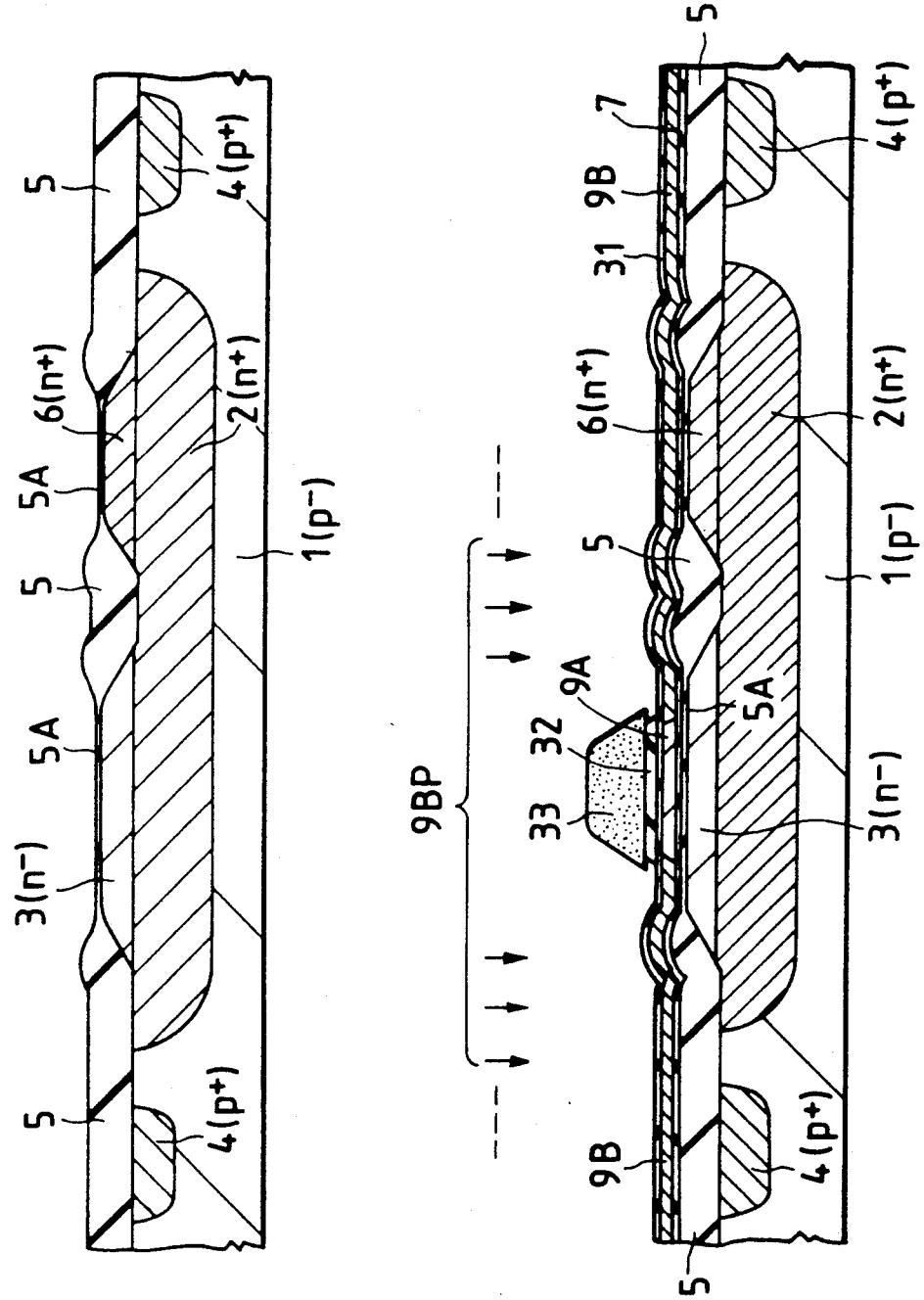

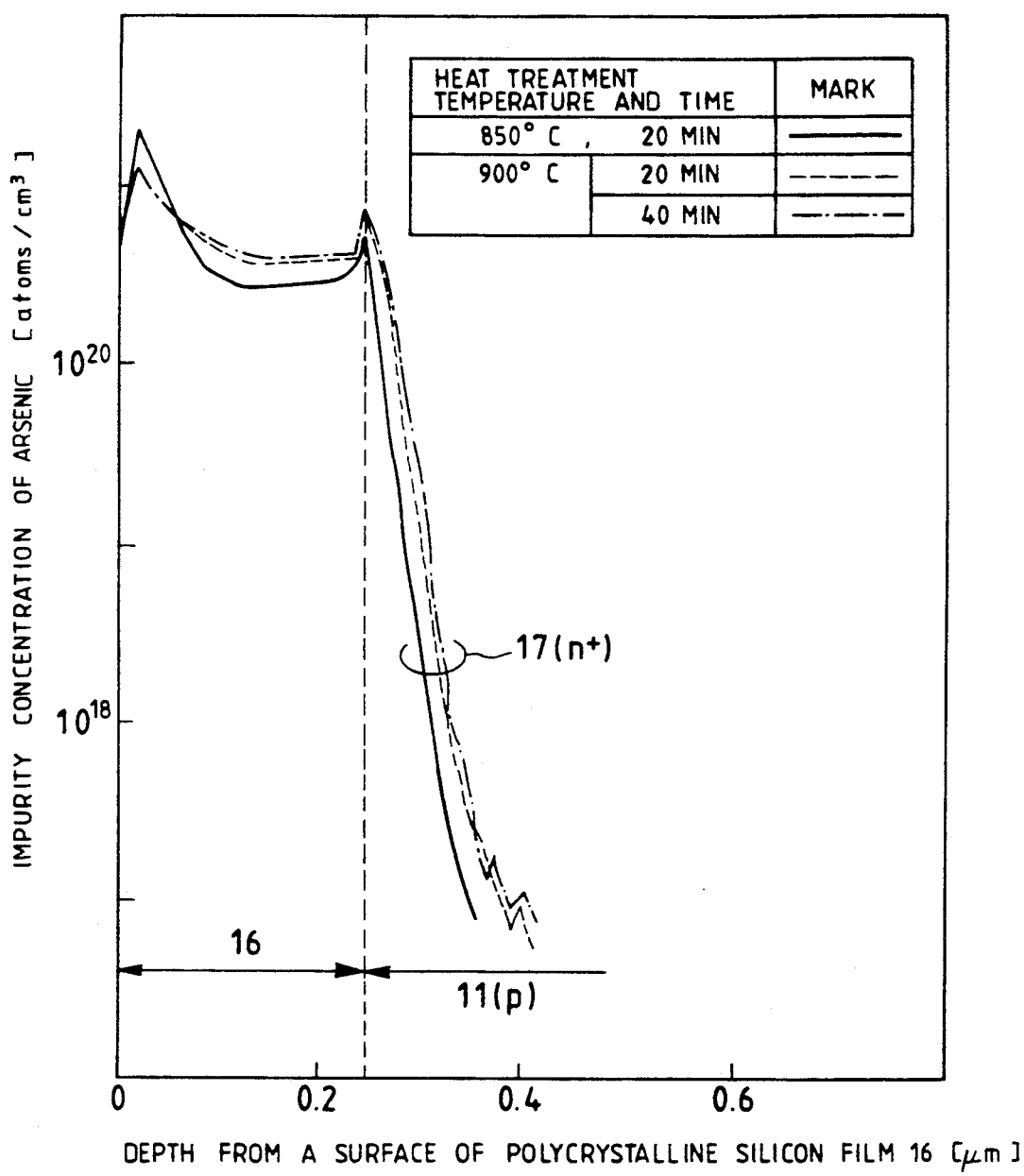

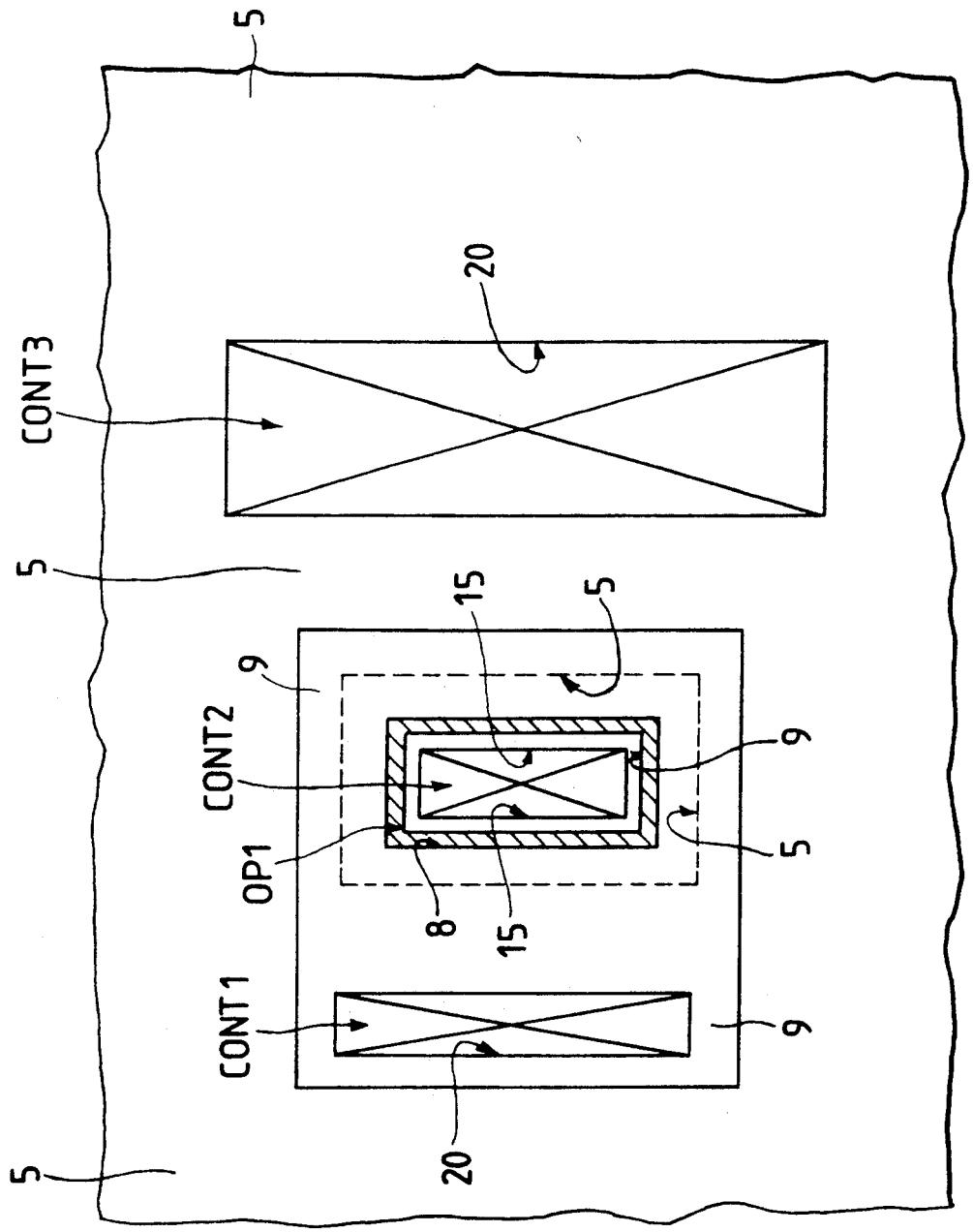

METHOD OF MANUFACTURING SEMICONDUCTOR INTEGRATED CIRCUIT BIPOLAR TRANSISTOR DEVICE

BACKGROUND OF THE INVENTION

The present invention relates to a technique which is effective in the application thereof to a semiconductor integrated circuit device having a self-aligned bipolar transistor.

The bipolar transistor being developed by the present inventor is formed by SEPT (Selective Etching of Polysilicon Technology). In the bipolar transistor which adopts this technology, a base lead-out electrode, an emitter opening, an emitter region and an emitter lead-out electrode can each be formed by self alignment with respect to a base region. In the bipolar transistor formed by this technology, it is not required to consider a mask alignment margin in the manufacturing process such as a base-emitter mask alignment margin, so the area occupied by the bipolar transistor can be reduced. As a result, the semiconductor integrated circuit device having this bipolar transistor can attain a high frequency characteristic or a high degree of integration.

In the aforesaid bipolar transistor it is considered that reducing the junction depth of the emitter region is important for attaining a high frequency characteristic or a high degree of integration. In the bipolar transistor being developed by the present invention, the junction depth of the emitter region is made shallow by the adoption of the following manufacturing process, which is not a known technique.

First, a polycrystalline silicon film serving as an emitter led-out electrode is deposited on a main surface of a p-type base region (an intrinsic base region) which is formed so as to be surrounded with a base lead-out electrode provided on a main surface of a semiconductor substrate. The polycrystalline silicon film is deposited throughout the whole surface of the semiconductor substrate by a CVD (Chemical Vapor Deposition) method at a film thickness of about 200 to about 250 nm. The polycrystalline silicon film is formed using a so-called nondoped polycrystalline silicon without introducing impurities which decrease the resistance value. The base lead-out electrode is formed by a polycrystalline silicon film deposited by the CVD method, with p-type impurity being introduced in the polycrystalline silicon film. On the surface of the polycrystalline silicon film base lead-out electrode, an insulating film (silicon oxide film) is formed for isolation by a thermal oxidation method. The size of the emitter opening for connection between the emitter lead-out electrode and the emitter region is defined substantially by the insulating film. This insulating film electrically isolates the base lead-out electrode and the emitter lead-out electrode from each other.

Next, an n-type impurity, e.g. As, is introduced into the polycrystalline silicon film (non-doped polycrystalline silicon). The n-type impurity is introduced in a sharp impurity atom concentration profile in order to enhance the controllability for the impurity concentration. Such sharp impurity atom concentration profile is obtained by an ion implantation method using 50-80 KeV energy. The As thus introduced under such conditions forms a peak of impurity concentration at a depth of about 50 nm from the surface of the polycrystalline silicon film.

Then, part of the n-type impurity introduced into the polycrystalline silicon film is diffused from the polycrystalline silicon film to the main surface portion of the p-type base region (the main surface of the single crystal silicon substrate) by a drive-in diffusion method using heat treatment, to form an n-type emitter region. By utilizing the drive-in diffusion method, the junction depth of the n-type emitter region can be made smaller than in a direct ion-implantation method, due to the lower temperature required for drive-in diffusion, and also to the absence of damage treatment needed for such problems as crystal defects of the surface of the single crystal silicon substrate. The n-type impurity remaining in the aforementioned polycrystalline silicon film is formed as an emitter lead-out electrode.

The bipolar transistor using such a polycrystalline silicon film for both the base lead-out electrode and the emitter lead-out electrode is also called a double-polySi-self-aligned bipolar transistor, which permits attenuation of an active region thereof, shallow junction and, thus, high speed. Such a bipolar transistor having a double-polySi structure is described, for example, in "Nikkei Microdevices", November 1985 number, pp. 67-78.

During development of a bipolar transistor formed by the foregoing SEPT method, the present inventors discovered the following problem. This problem will be explained below with reference to FIG. 25.

FIG. 25 illustrates a bipolar transistor Bip formed on a main surface of a semiconductor substrate 1 having an n-type collector region 3, a p-type base region 11 and an n-type emitter region 17. Around the p-type base region 11 there is formed a p-type external base region 10, on which is provided and electrically connected a base lead-out electrode 9 formed by a polycrystalline silicon film. Contacting and extending sideways of the external base region 10 in FIG. 25 there is provided an insulating film 14 for isolation which is formed by a polycrystalline silicon film for electrical isolation of an emitter lead-out electrode 18 and the base lead-out electrode 10 from each other. The emitter lead-out electrode 18 is provided so as to be connected to the main surface of the foregoing p-type base region 11 through an emitter opening 15.

The emitter lead-out electrode (polycrystalline silicon film) 18 of the bipolar transistor Bip having such double-polySi structure is formed along a stepped shape of the emitter opening 15. The stepped portion of the emitter opening 15 corresponds to the film thickness of the base lead-out electrode 9 and that of the insulating film 14, which electrically isolates the base lead-out electrode 9 from the emitter lead-out electrode 18. Since the polycrystalline silicon film emitter lead-out electrode 18 is deposited by CVD as noted previously, the film is almost uniform in thickness on both the flat portion and the stepped portion. More specifically, the polycrystalline silicon film 18 is formed so that the thickness thereof in the direction perpendicular to the semiconductor substrate 1 of the stepped portion around the emitter opening 15 is effectively larger than that of the central flat portion of the emitter opening 15. The concentration of n-type impurity (As) 17n which is introduced in the polycrystalline film around the emitter opening 15 is thus lower in the relatively thicker stepped portion than that of the central flat portion of the emitter opening in a position spaced a certain distance above the main surface of the p-type base region 11.

In other words, a peak position of the impurity concentration of the n-type impurity (As) 17n introduced in the stepped portion of the peripheral polycrystalline silicon film 18 is spaced from the main surface of the p-type base region 10 as compared with a peak position at the central flat portion of the emitter opening 15. Consequently, the amount of the n-type impurity (as) 17n diffused from the peripheral stepped portion to the main surface of the p-type base region 10 is smaller than that of the n-type impurity (As) 17n diffused from the central flat portion of the polycrystalline silicon film that forms the emitter lead-out electrode 18 to the main surface of the p-type base region 10, so that the diffusion distance of the n-type impurity (As) 17n becomes longer. More specifically, as is apparent from FIG. 25, diffusion paths b and c of the n-type impurity 17n introduced in the peripheral polycrystalline silicon film are longer than a diffusion path a of the n-type impurity 17n introduced in the central polycrystalline film of the emitter opening 15. Therefore, at the main surface of the p-type base region 10, the n-type impurity (As) 17n is not diffused up to the outer periphery of the emitter opening 15, and even when it is diffused in the main surface of the p-type base region 10, it is impossible to obtain an impurity concentration sufficient to invert the conductivity type of the p-type base region 10. Consequently, even if the n-type emitter region 17 is formed in the region defined by the emitter opening 15, the p-type base region 10 is present around the emitter region 17 in the emitter opening 15, so there has been the problem that the emitter lead-out electrode 18 and the p-type base region 10 are short-circuited in regions d shown in FIG. 25. This short-circuit decreases the yield in the manufacture of the semiconductor integrated circuit device and deteriorates the electrical reliability of the same device.

Such a problem is particularly conspicuous as the degree of integration increases. The size of the emitter opening, especially the emitter width, of the bipolar transistor tends to be reduced in accordance with the proportional reduction rule, but the polycrystalline silicon film emitter lead-out electrode 18 tends to become relatively thicker, contrary to the proportional reduction rule. It is necessary to ensure at least about 100 to about 150 nm as the thickness of the emitter electrode polycrystalline silicon film to prevent the penetration to the p-type base region 10 of n-type impurity which is introduced by ion implantation, to prevent the penetration to alloy pits by an aluminum electrode formed in the subsequent manufacturing step, and to reduce the amount of the film scraped off during washing and the amount of film consumed as silicide.

The foregoing short-circuit problem can be overcome by lengthening the diffusion distance of the n-type impurity for the formation of the emitter region, which is attained by increasing the heat treatment temperature and duration in the drive-in diffusion method. However, such high temperature and long heat treatment time create a problem in that the junction depth of the emitter region becomes large, and it is impossible to attain a high frequency characteristic or a high degree of integration of the bipolar transistor.

It is an object of the present invention to provide a technique capable of improving the yield in the manufacture of a semiconductor integrated circuit device having a self-aligned bipolar transistor.

It is another object of the present invention to provide a technique capable of improving the electrical reliability of the semiconductor integrated circuit device.

It is a further object of the present invention to provide a technique capable of improving a high frequency characteristic or the degree of integration of the semiconductor integrated circuit device.

The objects and novel features of the present invention will become more apparent from the following description and the accompanying drawings.

SUMMARY OF THE INVENTION

According to the present invention there is provided a method of manufacturing a semiconductor integrated circuit device having a self-aligned bipolar transistor wherein an emitter lead-out electrode is connected to an emitter region formed in a main surface of a semiconductor substrate through an emitter opening which is formed in a region surrounded by the side walls of a base lead-out electrode provided on the main surface of the substrate. Said manufacturing method comprises the steps of forming a silicon film selectively on the main surface in the emitter opening of the substrate; introducing impurity into the silicon film by ion implantation and diffusing the impurity into the main surface of the substrate to form the above emitter region; and connecting the emitter lead-out electrode to the emitter region through the said silicon film.

The silicon film on the main surface in the emitter opening of the semiconductor substrate is deposited by a selective CVD method.

The silicon film on the main surface in the emitter opening of the substrate is formed by introducing impurity which permits selective etching into the main surface in the region defined by the emitter opening of the substrate, depositing a silicon film throughout the whole surface of the substrate including the main surface portion of the substrate into which the impurity has been introduced, allowing the impurity introduced in the main surface of the substrate to flow up to a portion of the silicon film in the emitter opening to form the said portion of the silicon film at a higher impurity concentration than in the other portion, and removing by etching the other portion of a lower impurity concentration of the silicon film on the basis of the difference in impurity concentration of the silicon film.

According to the above manufacturing method of the present invention, on the main surface of the semiconductor substrate in the emitter opening there can be formed a silicon film whose thickness at the central portion of the emitter opening and thickness at the peripheral portion of the same opening both in the direction perpendicular to the semiconductor substrate are substantially equal to each other. Therefore, it is possible to introduce an emitter region-forming impurity into the above silicon film in such a position that the distance from the semiconductor substrate at the central portion of the emitter opening and that at the peripheral portion are substantially the same. Consequently, at the central and peripheral portions of the emitter opening the impurity can be diffused uniformly into the main surface of the substrate from the silicon film up to the edge or outside of the emitter opening, and an emitter region can be formed at a sufficient impurity concentration. As a result, it is possible to prevent short-circuiting between the base region of the bipolar transistor and the emitter lead-out electrode, whereby the yield in the manufacture of the semiconductor integrated circuit device can be improved. Furthermore, because of the prevention of such short-circuiting, it is possible to improve the electrical reliability of the semiconductor integrated circuit device.

Since the concentration of the impurity which forms the emitter region can be increased at the peripheral portion of the emitter opening, it is possible to lower the heat treatment temperature or to shorten the heat treatment time and thereby reduce the junction depth of the emitter region and that of the base region. Consequently, it is possible to improve the frequency characteristic of the bipolar transistor or to decrease the area occupied by the same transistor.

BRIEF DESCRIPTION OF THE DRAWINGS

FIGS. 3 to 18 are sectional views of the principal portion each showing a manufacturing step for the bipolar transistor;

FIGS. 19 and 20 are impurity concentration distribution diagrams in certain regions of the bipolar transistor;

FIG. 26 is a plan view of a principal portion showing patterns of lead-out electrodes and electrode contact portions in the bipolar transistor illustrated in FIG. 2.

DETAILED DESCRIPTION OF THE PREFERRED EMBODIMENTS

Figure 1:
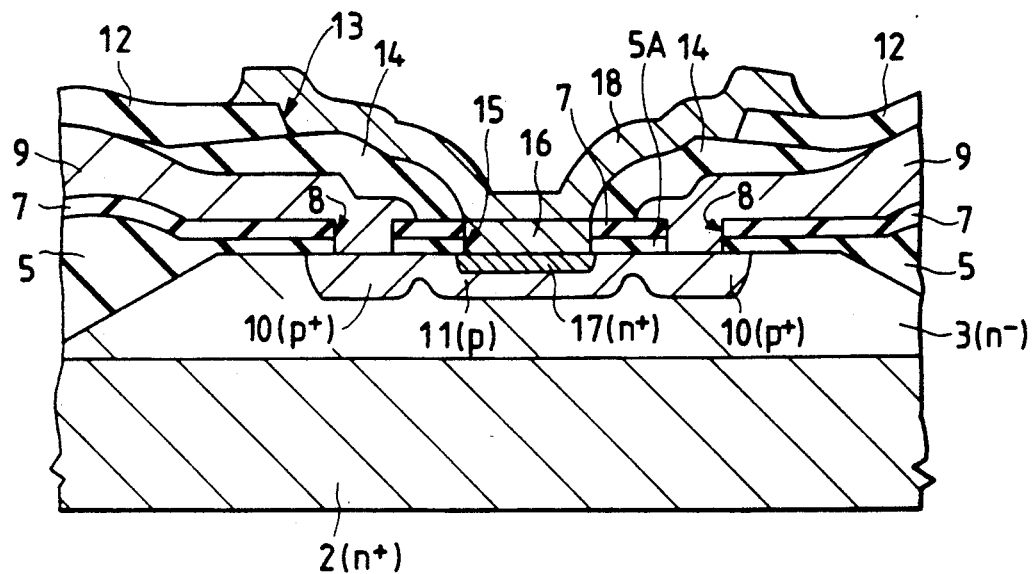
FIG. 1 is a partially enlarged sectional view of a bipolar transistor according to a first embodiment of the present invention.
Figure 25:
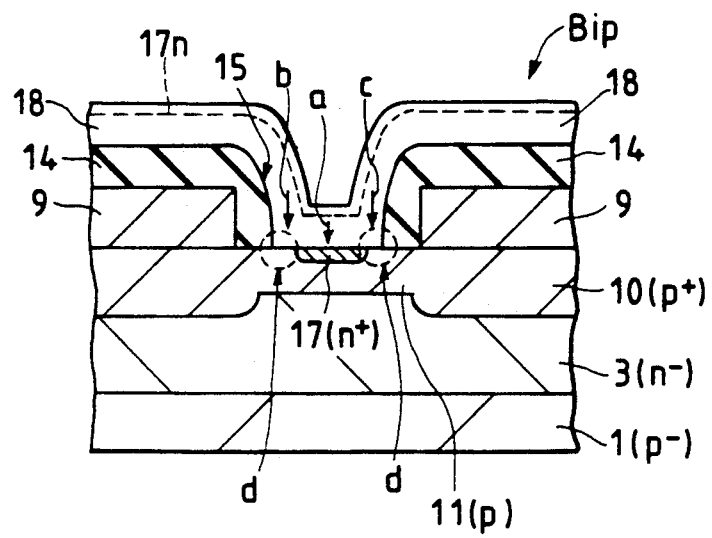
FIG. 25 is a sectional view of a bipolar transistor studied by the present inventor for explaining problems involved in the conventional bipolar transistor manufacturing method.

The construction of the present invention will be described hereinunder together with embodiments thereof applied to semiconductor integrated circuit devices each having a self-aligned bipolar transistor formed by SEPT.

In all of the drawings for illustrating the embodiments, the components having the same functions are indicated by the same reference numerals and repeated explanations thereof will be omitted.

First Embodiment

Figure 2:
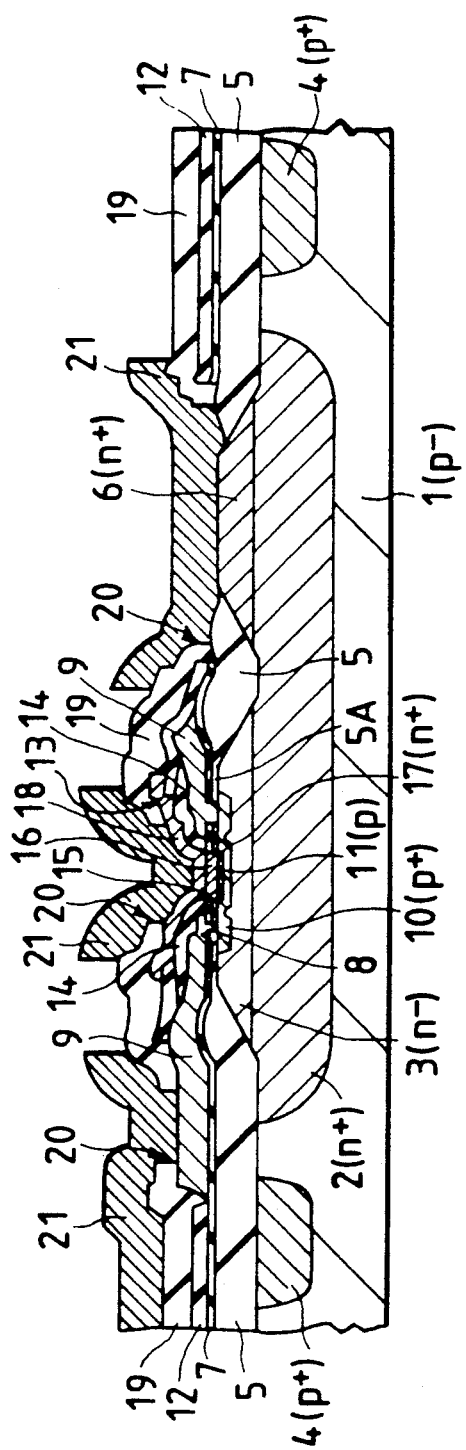
FIG. 2 is a sectional view of a principal portion of the bipolar transistor.

FIG. 2 (a sectional view of a principal portion) and FIG. 1 (a partially enlarged sectional view) illustrate the construction of a bipolar transistor according to the first embodiment of the present invention.

As shown in FIG. 2, the bipolar transistor is constituted in a main surface of an active region of a $p^-$-type semiconductor substrate 1 which is constituted by a single crystal silicon. The active region with the bipolar transistor formed therein is defined at its periphery by the $p^-$-type semiconductor substrate 1, a $p^+$-type semiconductor region 4 and an element isolation region constituted by an insulating film 5. Region 4 is thus isolated electrically from another active region (not shown) formed on the semiconductor substrate 1. The $p^+$-type semiconductor region 4 is provided in a non-active region of the $p^-$-type semiconductor substrate 1, while the insulating film 5 is provided on the main surface of the non-active region of the $p^-$-semiconductor substrate 1.

The bipolar transistor is a vertical npn type transistor comprising an n-type collection region, a p-type base region and an n-type emitter region.

The n-type collector region comprises a buried $n^+$-type semiconductor region 2, an $n^+$-type semiconductor region 6 for providing or picking out the collector potential (also called a sinker) and an $n^-$-type epitaxial layer 3. In the bipolar transistor-formed region, the buried $n^+$-type semiconductor region 2 is located between the $p^-$-type semiconductor substrate 1 and the $n^-$-type epitaxial layer 3. The $n^+$-type semiconductor region 6 for providing or picking out the collector potential is located in a main surface of the $n^-$-type epitaxial layer 3 so that the bottom thereof is in contact with the buried $n^+$-type semiconductor region 2. The $n^-$-type epitaxial layer 3 is constituted (grown) on the main surface of the $p^-$-type semiconductor substrate 1.

In the n-type collector region, a contact 21 is connected to the $n^+$-type semiconductor region 6 through a connection hole 20 formed in an inter-layer insulating film 19. For example, the contact 21 is formed of an aluminum alloy film, which is an aluminum film with Cu or both Cu and Si incorporated therein. Cu functions to improve the electromigration resistance, while Si functions to diminish an alloy spike phenomenon. Between the contact 21 and the $n^+$-type semiconductor region 6 is interposed a metallic film such as PtSi film and/or TiN film.

The p-type base region comprises a $p^+$-type semiconductor region 10 and a p-type semiconductor region 11, as shown in FIGS. 1 and 2. The $p^+$-type semiconductor region 10 is used as a graft base region (also called an extrinsic region), while the p-type semiconductor region 11 is used as an intrinsic base region. Both the $p^+$-type and p-type semiconductor regions 10, 11 are formed in the main surface of the $n^-$-type epitaxial layer 3 (a collector region of a low concentration).

In the p-type base region, to the $p^+$-type semiconductor region 10 as a graft base region there is connected one end of a base lead-out electrode 9 which extends onto an inter-layer insulating film 7 through a base opening 8 formed in the insulating film 7 and an insulating film 5A. The base lead-out electrode 9 is formed using a polycrystalline silicon film deposited by CVD, followed by introduction of a p-type impurity which decreases the resistance value of the polycrystalline silicon film. The position of one end (inner side wall portion) of the base lead-out electrode 9 is defined by the diffusion distance of the p-type impurity flowed up from the $p^+$-type semiconductor region 10, and it substantially determines the size of an emitter opening 15. That is, one end of the base lead-out electrode 9 is formed by self alignment with respect to the $p^+$-type semiconductor region 10. FIG. 26 illustrates electrode contact portions and patterns of lead-out electrodes in the bipolar transistor illustrated in FIG. 2. To make the figure easier to understand, the inter-layer insulating film, etc. are not shown therein. As illustrated in FIGS. 26 and 2, the base lead-out electrode 9 is constructed so as to surround and define the circumference of the emitter opening 15 at one end portion thereof. The other end of the base lead-out electrode 9 is connected to a contact 21 through the connection hole 20, CONT1, formed in the inter-layer insulating film 19. This contact 21 is formed by the same conductive layer as that of the contact 21 mentioned previously.

The n-type emitter region is constituted by an n+-type semiconductor region 17, which region 17 is formed in a main surface of the p-type semiconductor region 11, which is an intrinsic base region. The n+-type semiconductor region 17 is formed by the drive-in diffusion method. More particularly, it is formed by introducing an n-type impurity into a silicon film 16 which serves as an impurity diffusion source, and then diffusing the impurity into the main surface of the p-type semiconductor region 11. The silicon film 16 is formed selectively only in the region defined peripherally by the emitter opening 15 (connection hole CONT2) on a main surface of the n+-type semiconductor region 17 (or on the main surface of the n+-type semiconductor region 11 before the formation of the region 17). That is, the silicon film 16 is formed so as to be uniform in thickness at both the central and peripheral portions of the emitter opening 15. For example, the silicon film 16 is formed by a polycrystalline silicon film, which may be a single crystal silicon film or an amorphous silicon film, deposited by a selective CVD method. This polycrystalline silicon film is formed from a so-called non-doped polycrystalline silicon with n-type impurity not introduced at the time of the deposition, but with n-type impurity introduced prior to drive-in diffusion. This n-type impurity is introduced not only for forming the n+-type semiconductor region 17 but also for affording n-type conductivity for the silicon film 16. The silicon film 16 with the n-type impurity introduced therein is used as part of an emitter lead-out electrode 18. The drive-in diffusion method which employs the silicon film 16 as an impurity diffusion source will be described in detail later.

To the n+-type semiconductor region 17, which is an n-type emitter region, there is connected the emitter lead-out electrode 18 through the emitter opening 17 and the silicon film 16 interposed therebetween. The emitter opening 15 (connection hole CONT2) is formed in a region surrounded by an insulating film 14 for isolation which is formed on a side wall on one end side of the base lead-out electrode 9. The insulating film 14 on the base lead-out electrode 9 is formed by a silicon oxide film which is formed by applying a thermal oxidation treatment to the surface of the base lead-out electrode (polycrystalline silicon film) 9 in an opening 13 formed in an inter-layer insulating film 12. That is, the emitter opening 15 is formed by self alignment with respect to the base lead-out electrode 9. As a result, the emitter lead-out electrode 18 is formed by self alignment with respect to the base lead-out electrode 9. The emitter lead-out electrode 18 is formed by a polycrystalline silicon film deposited by CVD, and an n-type impurity is introduced into this polycrystalline film for decreasing the resistance value. The electrode 18 is connected to contact 21 (emitter electrode) through a connection hole 20 formed in the inter-layer insulating film 19.

The method of manufacturing the bipolar transistor described above will be explained below briefly with reference to FIGS. 3 to 18 (sectional views of a principal portion, showing manufacturing step by step).

First, a p⁻-type semiconductor substrate 1 formed of a single crystal silicon is prepared.

Next, an n-type impurity is introduced selectively into a main surface of the p⁻-type semiconductor substrate 1 in the region where the bipolar transistor is to be formed.

Figure 3:
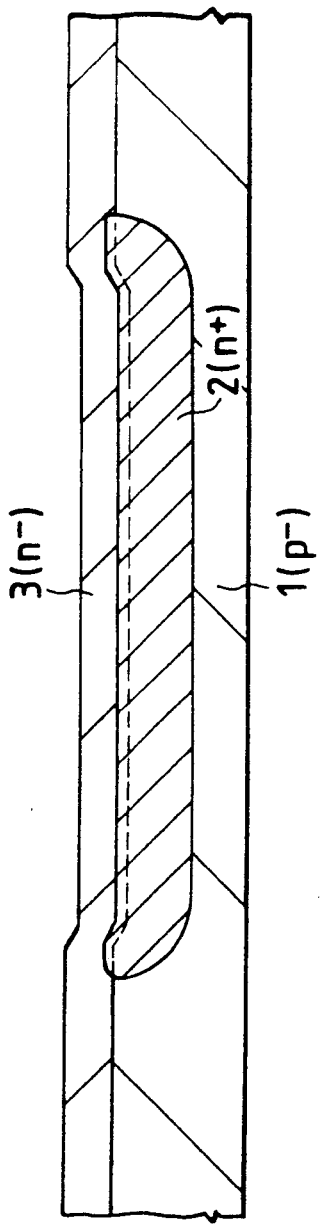

Then, as shown in FIG. 3, an n⁻-type- epitaxial layer 3 formed by a single crystal silicon is allowed to grow on the main surface of the p⁻-type semiconductor substrate 1. As the epitaxial layer 3 grows, the n-type impurity introduced is diffused into the main surface of the p⁻-type semiconductor substrate 1 and also into the n⁻-type epitaxial layer 3 to form a buried n+-type semiconductor region 2.

Figure 4:
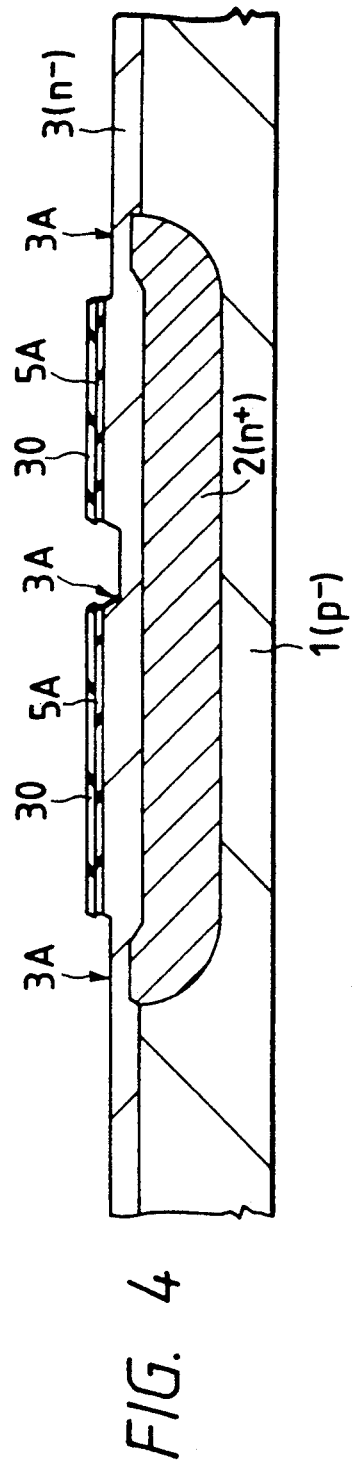

Next, as shown in FIG. 4, in the region (active region) where an n-type emitter region, a p-type base region and an n-type collector region are to be formed, there are formed an insulating film 5A and a mask 30 successively on a main surface of the n⁻-type epitaxial layer 3. The insulating film 5A is formed of a silicon oxide film which is formed by applying a thermal oxidation treatment to the surface of the n⁻-type epitaxial layer 3. The mask 30 is used as an etching mask and also as an oxidation impermeable mask, and may comprise, for example, a silicon nitride film deposited by CVD.

Then, the main surface of a non-active region of the n⁻-type epitaxial layer 3 is removed to a slight extent by etching, using the mask 30 as an etching mask, to form a groove 3A. The groove 3A is formed for decreasing the amount of thermal oxidation at the time of forming an insulating film 5 for element isolation in an element isolation region which is formed later.

Figure 5:
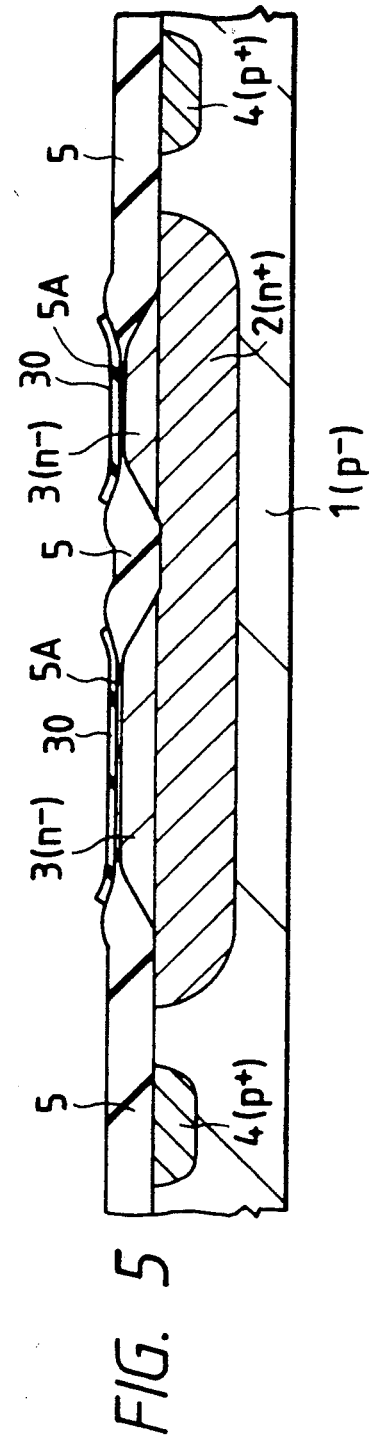

Next, as shown in FIG. 5, a p-type impurity is introduced into the main surface of the n⁻-type epitaxial layer 3 (and the p⁻-type semiconductor substrate 1) in the element isolation region (non-active region).

Then, using the mask 30, a thermal oxidation treatment is applied to a main surface of the groove 3A in the non-active region of the n⁻-type epitaxial layer 3 to form an insulating film 5 (field insulating film) for element isolation. The thermal oxidation treatment also results in stretch-diffusion of p-type impurity in region 1, which forms a p+-type semiconductor region 4.

Next, the mask 30 is removed. As shown in FIG. 6, in the region where an n-type collector region is to be formed, an n+-type semiconductor regional (sinker) 6 for providing or picking out the collector potential is formed in the main surface of the n⁻-type epitaxial layer 3. The n+-type semiconductor region 6 is formed by introducing an n-type impurity by ion implantation and then activating the n-type impurity introduced.

Then, as shown in FIG. 7, an inter-layer insulating film 7, a polycrystalline silicon film 9A, a mask 31 and a mask 32 are laminated successively to the whole surface of the substrate including the upper surfaces of the insulating film 5, and the insulating film 5A. The inter-layer insulating film 7 has etching selectivity for the polycrystalline silicon film and the silicon oxide film and it is used as an impurity introducing mask. For example, a silicon nitride film deposited by CVD is used as the inter-layer insulating film 7. The polycrystalline film 9A is formed at a thickness of, for example, 150–250 nm, by CVD of a so-called non-doped polycrystalline silicon with no resistance value-decreasing impurity introduced. The mask 31 is formed, for example, using a silicon oxide film deposited by CVD, while the mask 32 is formed, for example, using a silicon nitride film deposited by CVD.

Next, a mask 33 is formed on the mask 32 so as to cover the region where the n-type emitter region is formed. It is used as both an etching mask and an impurity introducing mask and is formed by a photoresist film for example.

Then, using the mask 33 as an etching mask, the mask 32 on the other region is removed by wet etching for example. Next, using mainly the mask 33 as an impurity introducing mask, a p-type impurity 9BP is introduced into the polycrystalline silicon film 9A through the mask 31 to form a polycrystalline silicon film 9B. The polycrystalline silicon film 9B constitutes a part of the base lead-out electrode 9. As the p-type impurity 9BP, boron is introduced by ion implantation.

Then, the mask 33 is removed. Subsequently, using the mask 32 patterned by the mask 33 as an etching mask, the portion of mask 31 not protected by the mask 32 is removed by wet etching for example, and as a result the mask 31 under the end portions of the mask 32 is subjected to side etching to expose a portion of the polycrystalline silicon film 9A. Thereafter, the mask 32 is removed.

Figure 8:
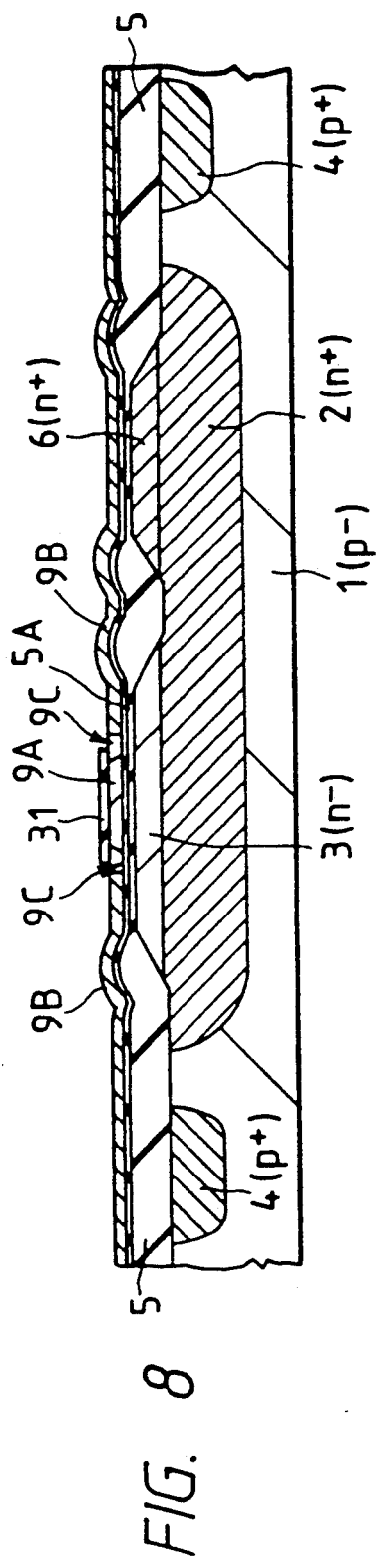

Next, as shown in FIG. 8, using the mask 31 and the polycrystalline silicon film 9B as etching masks, the portion of the polycrystalline silicon film 9A which has been exposed by side etching of the mask 31 is removed by etching to form an opening 9C. This etching is performed by an isotropic wet etching, using hydrazine [(NH$_2$)$_2$] for example. The opening 9C is formed as a fine opening defined by the amount of side etching for the mask 31 and that of etching for the polycrystalline silicon film 9A.

The above etching using hydrazine to form the opening 9C utilizes an etching selection ratio between the polycrystalline silicon film 9B doped with impurity (9BP) at a high concentration and the non-doped polycrystalline film 9A.

Then, the mask 31 is removed. Subsequently, using the polycrystalline silicon films 9A and 9B as etching masks, the inter-layer insulating film 7 of the opening portion 9C is removed selectively by etching. Thereafter, the polycrystalline silicon film 9A remaining on the inter-layer insulating film 7 is removed by selective etching using hydrazine.

Figure 9:
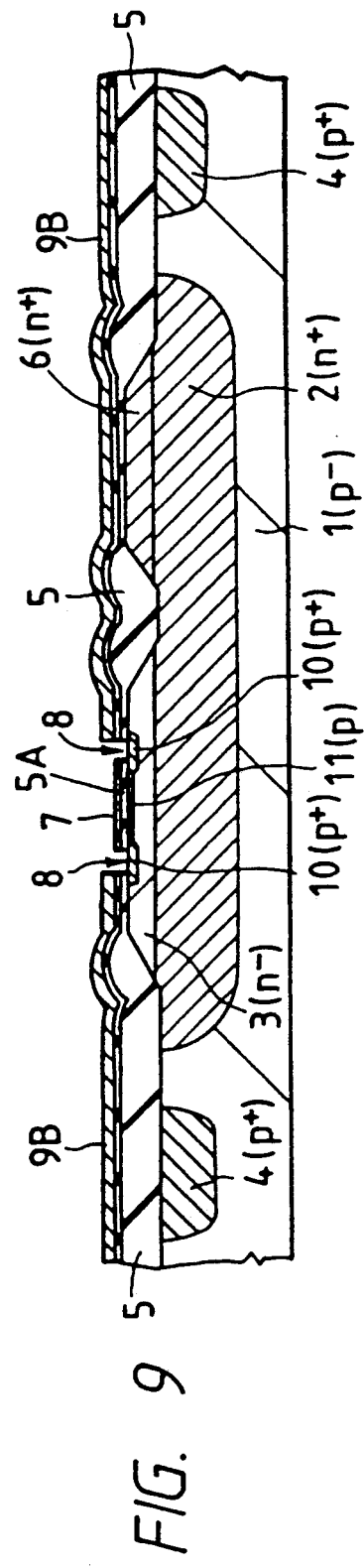

Next, as shown in FIG. 9, a p-type base region is formed by ion implantation of a p-type impurity using the polycrystalline silicon film 9B and the inter-layer insulating film 7 as impurity introducing masks. Although the process sequence for the formation of the p-type base region is not limited to the one described, a p$^+$-type semiconductor region 10 as a graft base (extrinsic base) region is formed after formation of a p-type semiconductor region 11 which is an intrinsic base region. The intrinsic base region 11 is formed by introducing a p-type impurity into the main surface of the n$^-$-type epitaxial layer through the inter-layer insulating film 7 and the insulating film 5A according to an ion implantation method using the polycrystalline film 9B as an impurity introducing mask. The p-type impurity may be boron (B) of about $10^{13}$ atoms/cm$^2$, introduced by an ion implantation method using energy of approximately 30 KeV. The p-type impurity is also introduced in the graft base forming region. The p$^+$-type semiconductor region 10 is formed by introducing a p-type impurity into the main surface of the n$^-$-type epitaxial layer 3 by ion implantation through the insulating film 5A using the polycrystalline silicon film 9B and the inter-layer insulating film 7 as impurity introducing masks. By way of example, the p-type impurity may be BF$_2$ at $10^{15}$ atoms/cm$^2$, which is introduced by an ion implantation method using energy of approximately 30 KeV. The p-type impurity for forming the graft base region referred to above is not introduced in the intrinsic base forming region. The p$^+$-type semiconductor region 10 is formed by self alignment with respect to the p-type semiconductor region 11, which is the intrinsic base region.

Then, the insulating film 5A exposed from the polycrystalline silicon film 9B and the inter-layer insulating film 7 is removed selectively by wet etching for example to form a base opening 8 (OP1). The base opening 8 (OP1) has a planar pattern as indicated by a hatched portion in FIG. 26.

Figure 10:
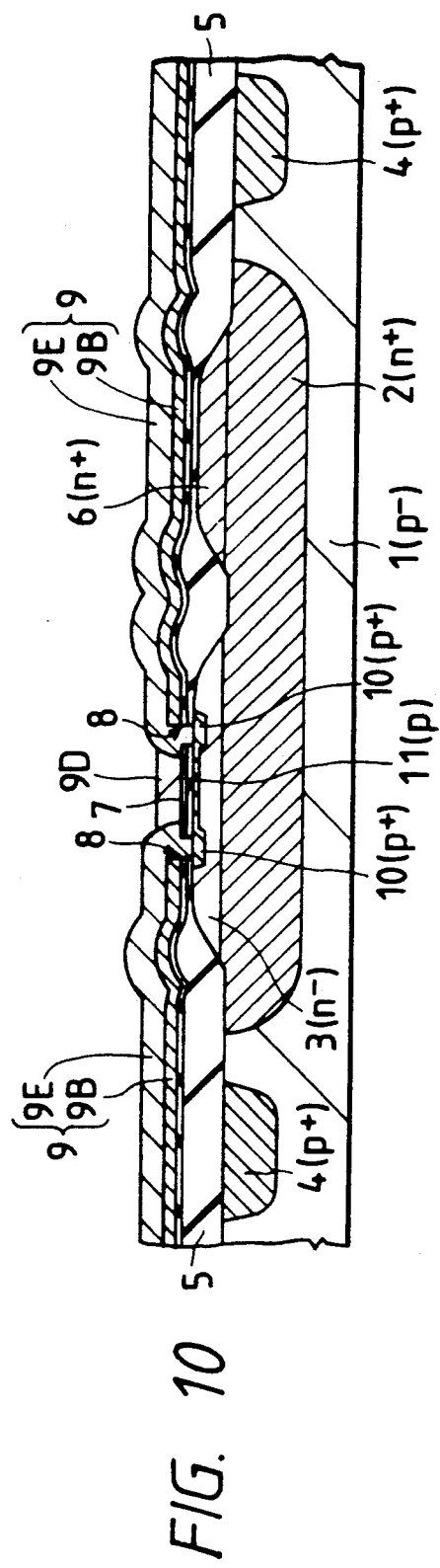

Next, as shown in FIG. 10, a polycrystalline silicon film 9D is formed on the whole substrate surface including the upper surface of the p$^+$-type semiconductor region (graft base region) 10 (exposed by the base opening 8) and the polycrystalline silicon film 9B. The polycrystalline silicon film 9D is formed at a thickness of, say, 400 to 600 nm by deposition according to the CVD method. No impurity for decreasing the resistance value is introduced in the film 9D.

Then, a heat treatment is applied to the whole substrate surface to diffuse both the p-type impurity introduced in the p$^+$-type semiconductor region 10 and that in the polycrystalline silicon film 9B into the polycrystalline silicon film 9D to form a p-type polycrystalline silicon film 9E. The above heat treatment is performed, for example, at a temperature of 900° to 1,000° C. for 30 to 50 minutes. Part of the polycrystalline silicon film 9D remains on the inter-layer insulating film 7 (0 on the n-type emitter region forming area) without introduction of p-type impurity. The residual amount of the polycrystalline silicon film 9D is determined by the diffusion distance of the p-type impurity out-diffused upward from the p$^+$-type semiconductor region 10 and it is determined by self alignment with respect to the p$^+$-type semiconductor region 10.

Figure 19:
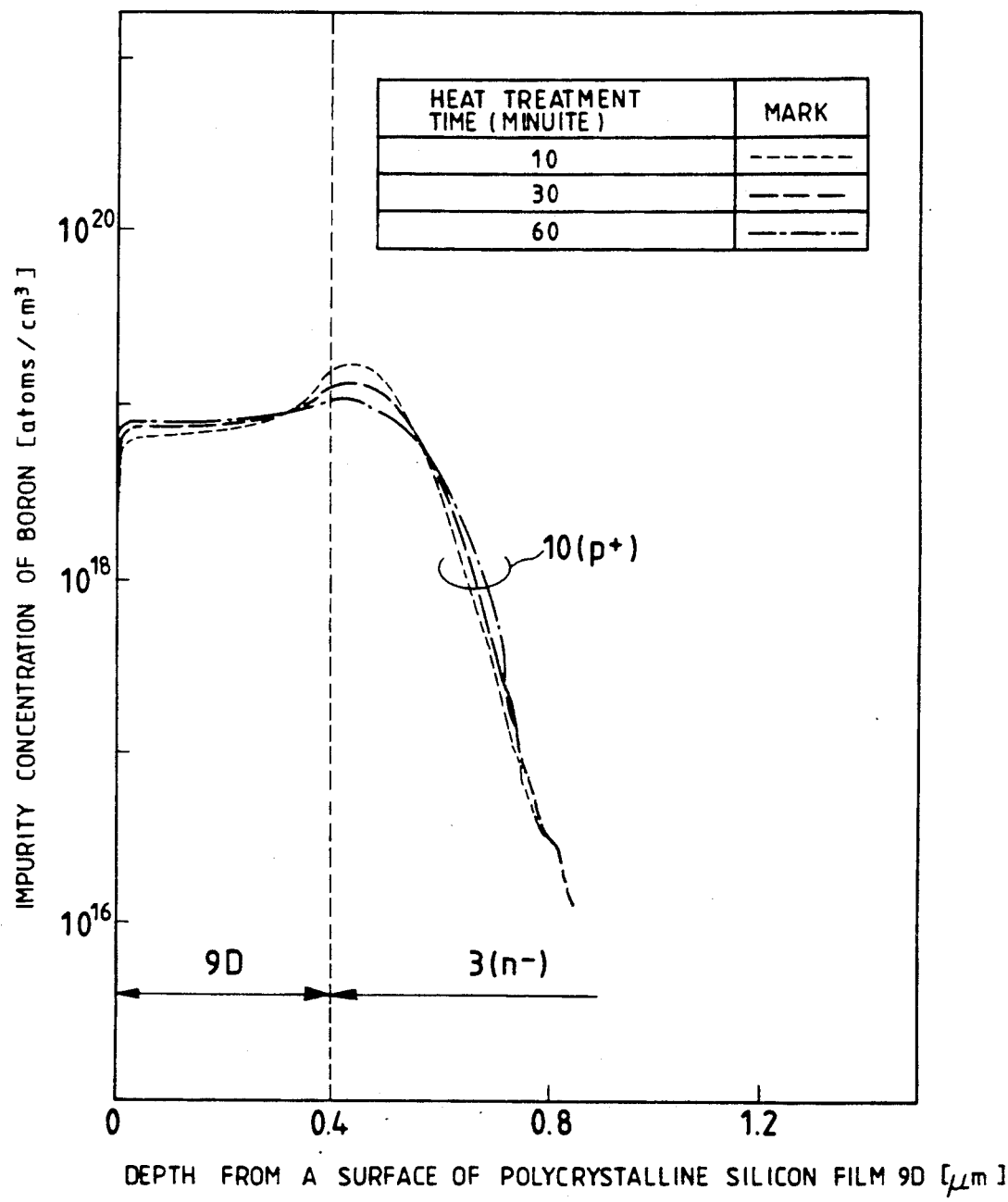

FIG. 19 shows the dependence on heat treatment time of the junction depth of the p$^+$-type semiconductor region 10 and the concentration of impurity flowing up therefrom to the polycrystalline silicon film 9D. As shown in the same figure, when the impurity concentration in the p$^+$-type semiconductor region 10 and that of the p-type impurity flowing up to the polycrystalline silicon film 9D reach an equilibrium state, the respective impurity concentration distributions scarcely vary with increase of the heat treatment time. Moreover, as shown in FIG. 19, the flowing-up of the impurity to the polycrystalline silicon film 9D reaches an equilibrium state in an early stage. That is, the pn junction depth of the p$^+$-type semiconductor region 10 can be made shallow stably, and the flowing-up of the impurity to the polycrystalline silicon film 9D can be done in a short time.

Figure 11:
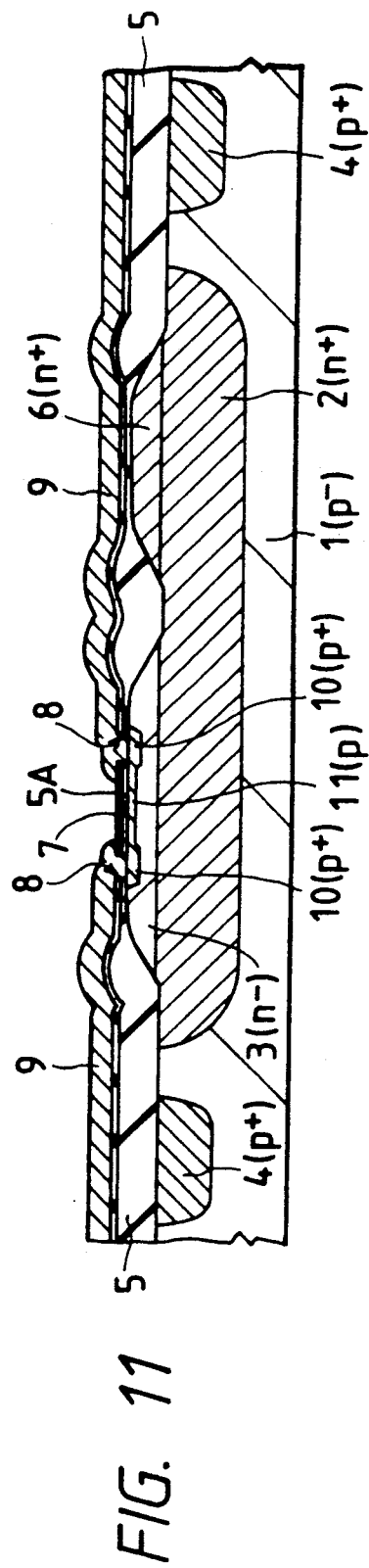

Next, the foregoing residual polycrystalline silicon film 9D is removed selectively by a wet etching method using hydrazine, and the base lead-out electrode 9 is formed by the residual polycrystalline silicon films 9B and 9E, as shown in FIG. 11. Thereafter, a predetermined patterning is applied to the base lead-out electrode 9, as shown in FIG. 12.

Figures 12, 13:
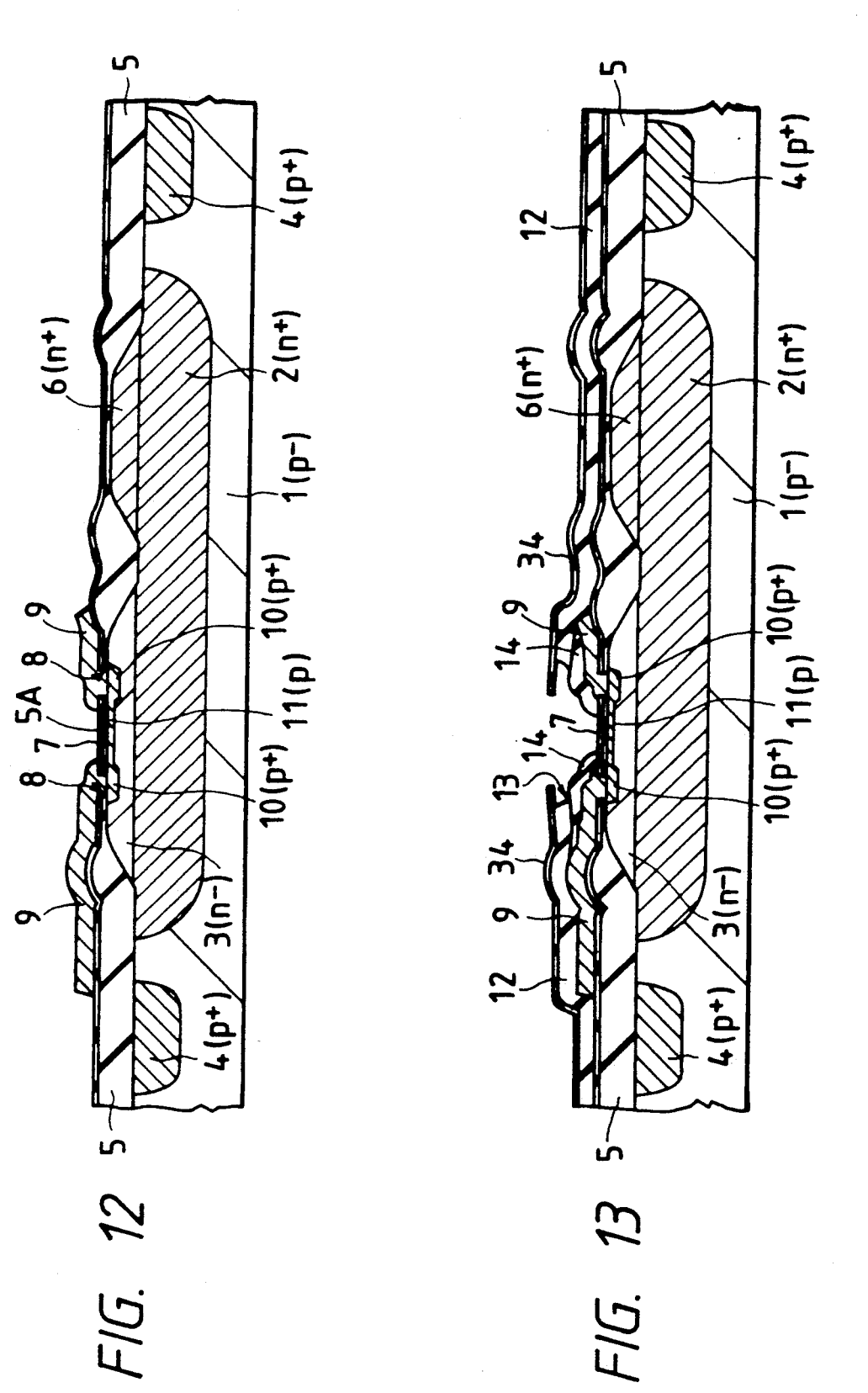

Then, as shown in FIG. 13, an inter-layer insulating film 12 and a mask 34 are laminated successively to the whole substrate surface including the upper surface of the base lead-out electrode 9. The inter-layer insulating film 12 may be a silicon oxide film, while the mask 34 may be a silicon nitride film, both deposited by CVD, for example, because mask 34 is both an etching mask and a non-oxidizable mask.

Next, in the n-type emitter region forming area, the mask 34 is removed partially and thereafter the interlayer insulating film 12 is removed partially using the mask 34 as an etching mask to form an opening 13. For example, the opening 13 is formed by an isotropic wet etching method. As a result of formation of the opening 13, a portion of one end side of the base lead-out electrode 9 is exposed.

Then, using the inter-layer insulating film 7 located sideways of the mask 34 and the opening 13 as a non-oxidizable mask, a thermal oxidation treatment is applied to the whole substrate surface to form an insulating film 14 for isolation on the surface of one end portion of the base lead-out electrode 9. The insulating film 14 is formed of a silicon oxide film by oxidizing the surface of the base lead-out electrode 9. It is formed to have a thickness of, for example, 300 to 400 nm.

Figure 14:
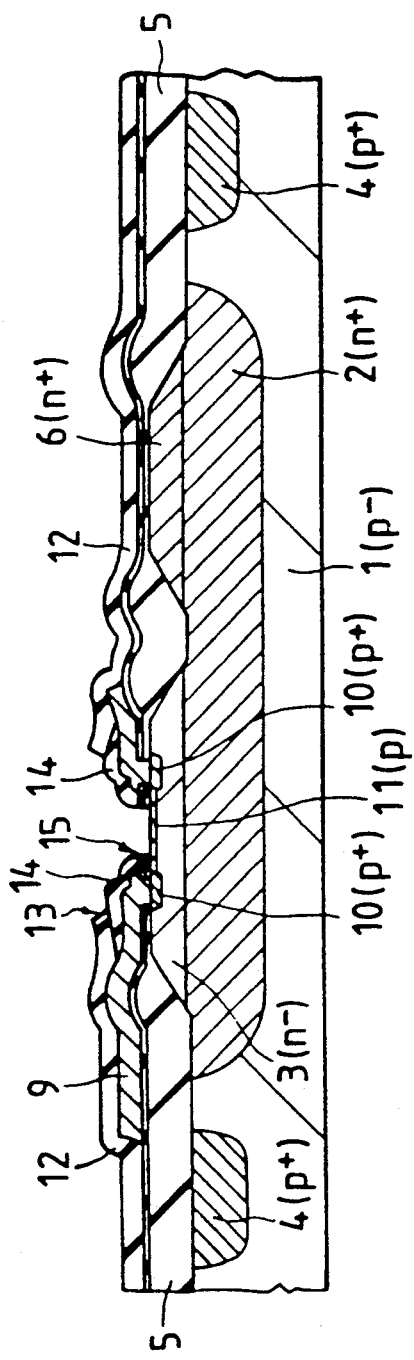

Next, the mask 34 and the exposed portion of the inter-layer insulating film 7 are removed. Thereafter, as shown in FIG. 14, the exposed portion of the insulating film 5A in the region defined (surrounded) by the insulating film 14, which is formed on the surface of the side wall portion of the base lead-out electrode 9, is removed to form an emitter opening 15. As a result, a main surface of the p-type semiconductor region 11, which is an intrinsic base region of the p-type base region, is exposed.

Figure 15:
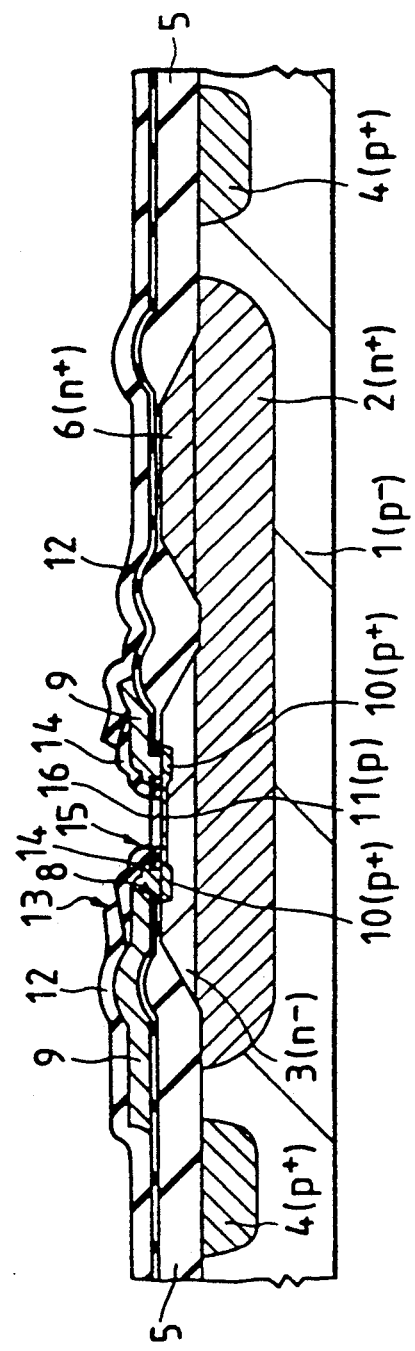

Then, as shown in FIG. 15, in the region defined by the emitter opening 15, a silicon film 16 is formed selectively only on the main surface of the p-type semiconductor region (intrinsic base region) 11 exposed from the emitter opening 11. As noted previously, the silicon film 16 is used as an impurity diffusion source mainly for forming the n-type emitter region (n+-type semiconductor region 17) and also as part of the emitter lead-out electrode. For example, the silicon film 16 is formed by deposition according to a selective CVD method using $SiH_2Cl_2$—$H_2$—HCl gas. Thus, the silicon film 16 is grown only on the main surface of the p-type semiconductor region 11, and such a selectively deposited silicon film is not formed on the interlayer insulating film 12 and the insulating film 14. Further, the silicon film 16 is formed to have a uniform thickness at both the central and peripheral portions of the emitter opening 15. The deposition of the silicon film 16 is performed, for example, by setting the composition ration of the aforementioned source gas at $SiH_2Cl_2$:HCl = 1:1 and under the conditions of about 800° C., 30 torr. Under the deposition conditions just described the silicon film 16 is formed as a polycrystalline silicon film. This polycrystalline silicon film is formed of a so-called nondoped polycrystalline silicon. Since the polycrystalline silicon film has a crystal grain boundary, any impurity introduced into the polycrystalline silicon film can be diffused into the main surface of the p-type semiconductor region 11 more efficiently than if a single crystal silicon film were to be used. Nevertheless, the foregoing CVD method permits the growth of a single crystal silicon film by raising the film forming temperature and reducing the pressure. The silicon film 16 may thus be formed using a single crystal silicon film.

Since the silicon film 16 does not damage the main surface of the p-type semiconductor region 11 (substrate) during the introduction of impurity by ion implantation, it is formed at a thickness of about 100 nm or more, taking into account the amount thereof removed during the washing step. In this embodiment, the silicon film 16 is formed at a thickness of 150 to 250 nm. In the case where the silicon film 16 is used not as part of the emitter lead-out electrode but as the emitter lead-out electrode itself and the surface thereof is silicided, it is necessary for the silicon film 16 to have a thickness of at least 200 nm because the silicon film 16 is silicided 100 nm or so.

Next, a thin silicon oxide film (not shown) is formed on the surface of the silicon film 16. The silicon oxide film is formed at a thickness of 15 to 25 nm, for example by applying a thermal oxidation treatment to the surface of the silicon film 16. The silicon oxide film can prevent heavy metal contamination and diminish the damage caused by the introduction of impurity.

Figure 16:
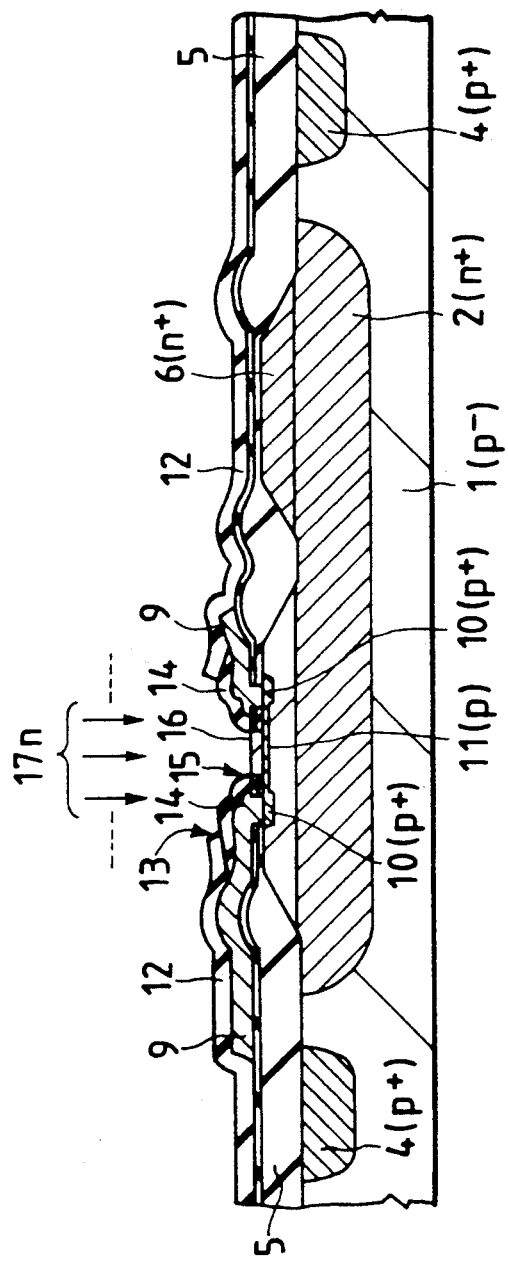

Then, as shown in FIG. 16, an n-type impurity 17n is introduced at least into the silicon film 16. In introducing the n-type impurity 17n, the insulating film 14 and the inter-layer insulating film 12 are used as impurity introducing masks. Alternatively, a photoresist film is formed and used as an impurity introducing mask. For example, the n-type impurity 17n is introduced by an ion implantation method using energy of about 50 to 80 KeV and using arsenic (As) of about $10^{16}$ atoms/cm$^2$. Under these implantation conditions a peak value of the impurity concentration can be obtained at a depth of about 50 nm surface of the silicon film 16. Since the thickness of the silicon film 16 is uniform at both the central and peripheral portions of the emitter opening 15, it is possible to make the impurity concentration distribution uniform at both the central and peripheral portions of the emitter opening 15.

Figure 17:
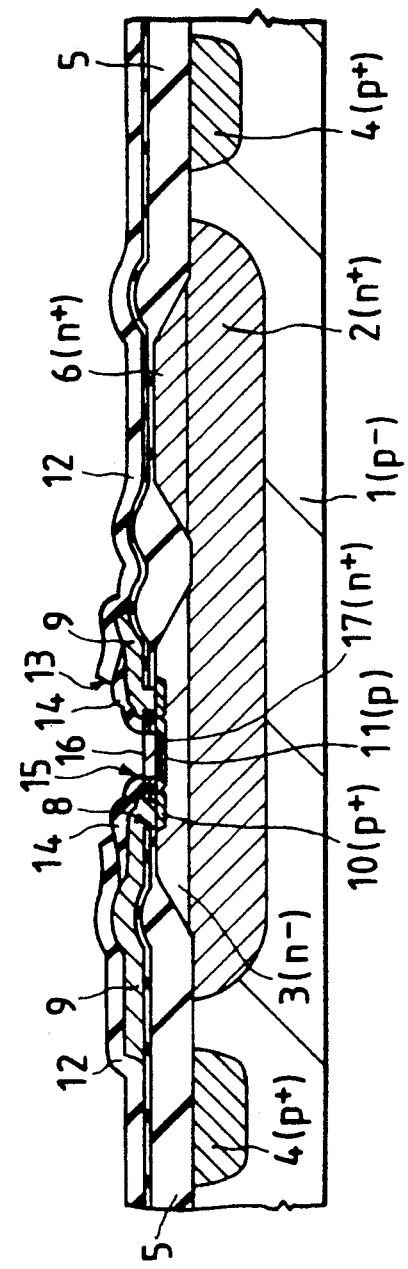

Next, as shown in FIG. 17, by a drive-in diffusion method the n-type impurity 17n which has been introduced into the silicon film 16 is diffused into the main surface of the p-type semiconductor region 11 to form an n+-type semiconductor region 17 which is the n-type emitter region. This drive-in diffusion method is carried out, for example, at a temperature of 900° to 1,000° C. for 40 to 60 minutes.

FIG. 20 shows how the concentration of the n-type impurity 17n introduced into the silicon film 16 and the junction depth of the n+-type semiconductor region 17 formed by drive-in diffusion from the silicon film 16 depend on the heat treatment time. As shown in FIG. 20, when the impurity concentration in the silicon film 16 and that in the n+-type semiconductor region 17 diffused by the drive-in method to the p-type semiconductor region reach an equilibrium state, the respective impurity concentrations scarcely change even with increase of the heat treatment time and temperature. Moreover, as shown in the same figure, the drive-in diffusion to the p-type semiconductor region 11 reaches an equilibrium state in an early stage. That is, the drive-in diffusion of the n-type impurity 17n from the silicon film 16 to the p-type semiconductor region 11 can be performed in a short time. Moreover, the pn junction of the n+-type semiconductor region 17 can be formed shallowly.

Next, a polycrystalline silicon film is deposited on the entire surface of the inter-layer insulating film 12 including the upper surface of the silicon film 16 in the emitter opening 15. For example, the polycrystalline silicon film is formed at a thickness of 100 to 200 nm by deposition according to the CVD method. Into this polycrystalline silicon film there is introduced an n-type impurity, e.g. As or P, for decreasing the resistance value.

Figure 18:
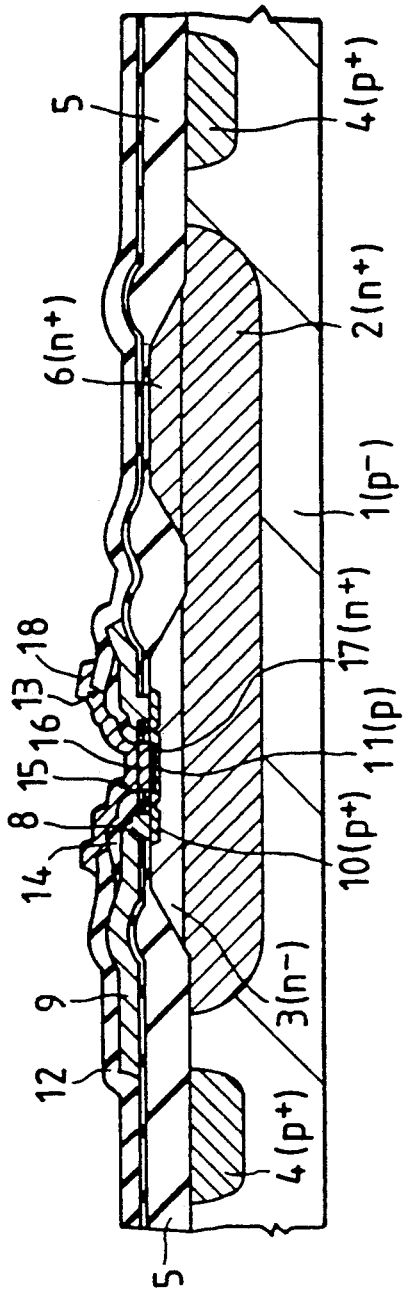

Then, as shown in FIG. 18, a predetermined patterning is applied to the polycrystalline silicon film to form an emitter lead-out electrode 18. The emitter lead-out electrode 18 is connected to the silicon film 16 which is then used as part of the emitter lead-out electrode 18.

The provision of the polycrystalline silicon film 16 which is doped to n type on the n-type emitter region 17 is advantageous also for improving the current amplification factor, $h_{fe}$, of the bipolar transistor because Hall current flowing, for example, from the base region of the bipolar transistor to the emitter region thereof can be suppressed effectively by the polycrystalline silicon film 16.

Thus, according to the present invention, in a method of manufacturing a semiconductor integrated circuit device having a self-aligned bipolar transistor wherein the emitter lead-out electrode 18 is connected to the $n^+$-type semiconductor region (n-type emitter region) 17 formed in the main surface of the p-type semiconductor region (intrinsic base region) 11 through the emitter opening 15 which is formed in the region surrounded with the side walls of the base lead-out electrode 9, there are provided a step of forming the silicon film 16 selectively on only the main surface of the p-type semiconductor region 11 in the emitter opening 15, a step of introducing the n-type impurity 17n into the silicon film 16 by ion implantation and diffusing it into the main surface of the p-type semiconductor region 11 to form the $n^+$-type semiconductor region 17 which is the emitter region, and a step of connecting the emitter lead-out electrode 18 to the $n^+$-type semiconductor region 17 through the silicon film 16. The silicon film 16 on the main surface of the p-type semiconductor region 11 in the emitter opening 15 is deposited by a selective CVD method. Under this construction, the silicon film 16 can be formed at a uniform thickness on the main surface of the p-type semiconductor region 11 in the emitter opening 15. The n-type impurity 17n can be introduced into the silicon film 16 with a substantially equal impurity concentration distribution at both the central and peripheral portions of the is the n-type emitter region) can thus be formed by diffusing the n-type impurity 17n into the main surface of the p-type semiconductor region 11 from the silicon film 16 uniformly at both the central and peripheral portions of the emitter opening 15, allowing the impurity 17n to diffuse sufficiently up to the outside of the edge of the emitter opening 15 and enhancing the impurity concentration of the edge portion. As a result, the p-type semiconductor region 11, which is the p-type base region of the bipolar transistor, as well as the emitter lead-out electrode 18 can each be prevented from being short-circuited through the emitter opening 15, whereby the yield in the manufacture of the semiconductor integrated circuit device can be improved. Moreover, since the short-circuit of the p-type semiconductor region 11, which is the p-type base region of the bipolar transistor, and that of the emitter lead-out electrode 18 can be prevented, it is possible to improve the electrical reliability of the semiconductor integrated circuit device.

Further, at the peripheral portion of the emitter opening 15 the diffusion distance and impurity concentration of the n-type impurity 17n which forms the $n^+$-type semiconductor region 17 as the n-type emitter region can be increased, so it is possible to reduce or shorten the heat treatment temperature or time during the drive-in diffusion step and make shallow the junction depth of the n-type emitter region and that of the p-type base region. As a result, it is possible to improve the emitter-grounded current amplification factor, $h_{fe}$, of the bipolar transistor and decrease its parasitic capacity, thus permitting improvement of the frequency characteristics of the semiconductor integrated circuit device.

Additionally, since the area occupied by the bipolar transistor can be diminished, it is possible to improve the degree of integration of the semiconductor integrated circuit device.

After formation of the emitter lead-out electrode 18 shown in FIG. 18, an inter-layer insulating film 19 is formed on the extra surface of the substrate including the upper surface of the emitter lead-out electrode 18, as shown in FIG. 2. For example, the inter-layer insulating film 19 is formed by a silicon oxide film deposited according to the CVD method.

Then, the inter-layer insulating film 19 covering the semiconductor region 6, base lead-out electrode 9 and emitter lead-out electrode 18, is removed to form collector connection hole 20 (CONT3), base connection hole 20 (CONT1) and emitter connection hole 20 (CONT2), shown in FIG. 26. A contact 21 is formed for connection to the region 6 and the lead-out electrodes 9, 18 through the connection holes 20, as shown in FIG. 2.

Next, though not shown, a passivation film is deposited on the whole substrate surface including the upper surface of the contact 21, whereby the semiconductor integrated circuit device of this embodiment is almost completed.

Second Embodiment

According to this second embodiment, the silicon film 16 is formed by another method.

Figure 21:
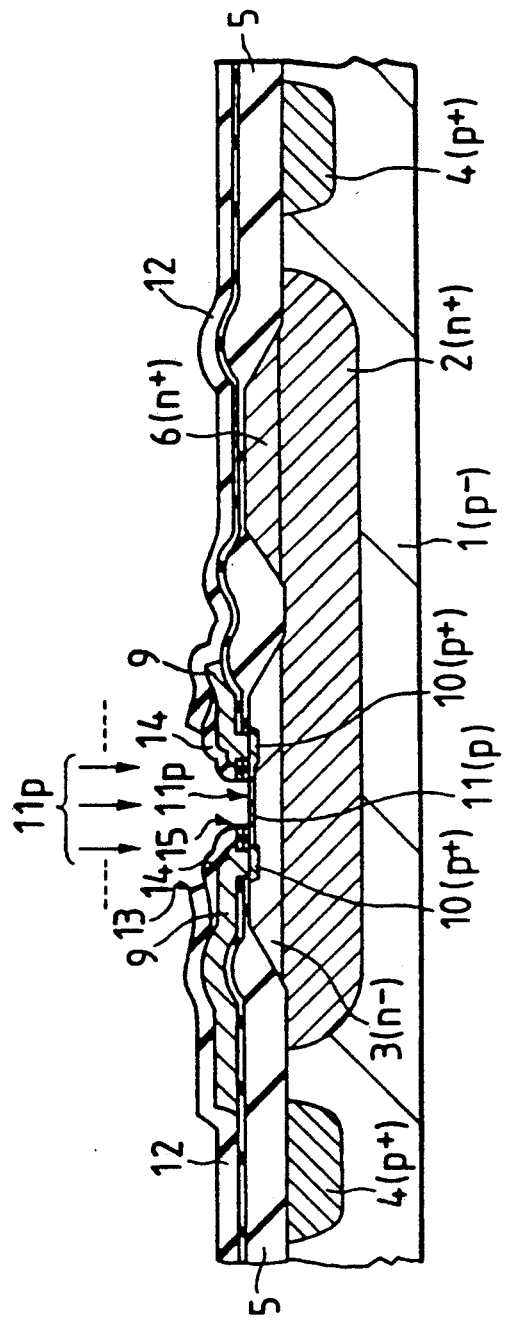
FIGS. 21 to 23 are sectional views of a principal portion each showing a manufacturing step for a bipolar transistor according to a second embodiment of the present invention.

The manufacture of a semiconductor integrated circuit device having a bipolar transistor according to the second embodiment will be described below briefly with reference to FIGS. 21 to 23 (sectional views of a principal portion showing manufacturing step by step).

In the method of manufacturing the bipolar transistor in the second embodiment, the steps up to the step of forming the emitter opening 15 shown in FIG. 14 are the same as in the first embodiment, so explanations thereof will be omitted. After formation of the emitter opening 15, a p-type impurity 11p is introduced into the main portion of the p-type semiconductor region (intrinsic base region) 11 in the region defined by the emitter opening 15, as shown in FIG. 21. The p-type impurity 11p is allowed to flow up into the silicon film 16 which serves as an impurity diffusion source for forming an emitter region in a later step and it is introduced to permit the silicon film 16 to survive selective etching. This selective etching cannot be applied unless the difference in impurity concentration of the p-type impurity 11p which flows up into the silicon film is about $10^{19}$ to $10^{20}$ atoms/cm$^3$ or more in the case where hydrazine is used for the etching. More specifically, assuming that most of the p-type impurity 11p which has been introduced into the p-type semiconductor region 11 flows up into the silicon film 16, it is preferable that the p-type impurity, BF$_2$ of, about, $1 \times 10^{15}$ to $2 \times 10^{15}$ atoms/cm$^2$ be introduced by an ion implantation method using a low energy of about 30 to 40 KeV.

According to a study made by the present inventor, most of the impurity (p-type impurity 11p) present in the interface between the polycrystalline silicon film 16 and the single crystal silicon region 11 (the intrinsic base region) is diffused into the polycrystalline silicon film 16 having a large crystal grain boundary.

Next, a silicon film 16A is formed on the entire upper surface of the inter-layer insulating film 12 including the main surface of the p-type semiconductor region 11 in the emitter opening 15. For example, the silicon film 16A is formed by a polycrystalline silicon film deposited according to the CVD method. This polycrystalline silicon film contains no impurity for decreasing the resistance value. Like the silicon film 16 used in the first embodiment, the silicon film 16A is used as an impurity diffusion source, so it is formed at a thickness of about 150 to 200 nm.

Figure 22:
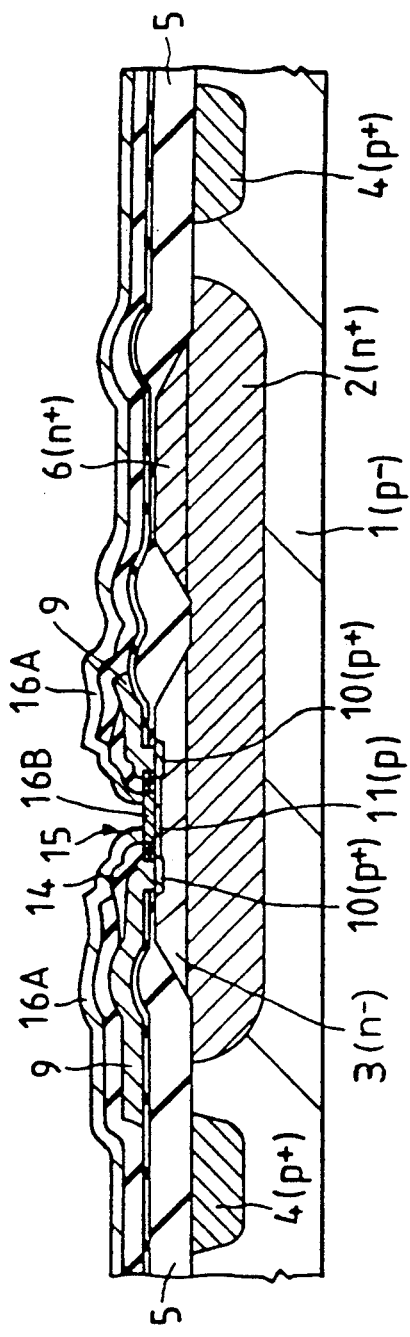

Then, as shown in FIG. 22, heat treatment is applied, allowing the p-type impurity 11p pre-introduced into the main surface of the p-type semiconductor region 11 to flow up into the silicon film 16A in the region defined by the emitter opening 15 to thereby form a silicon film 16B having a higher impurity concentration than in the other regions.

Figure 24:
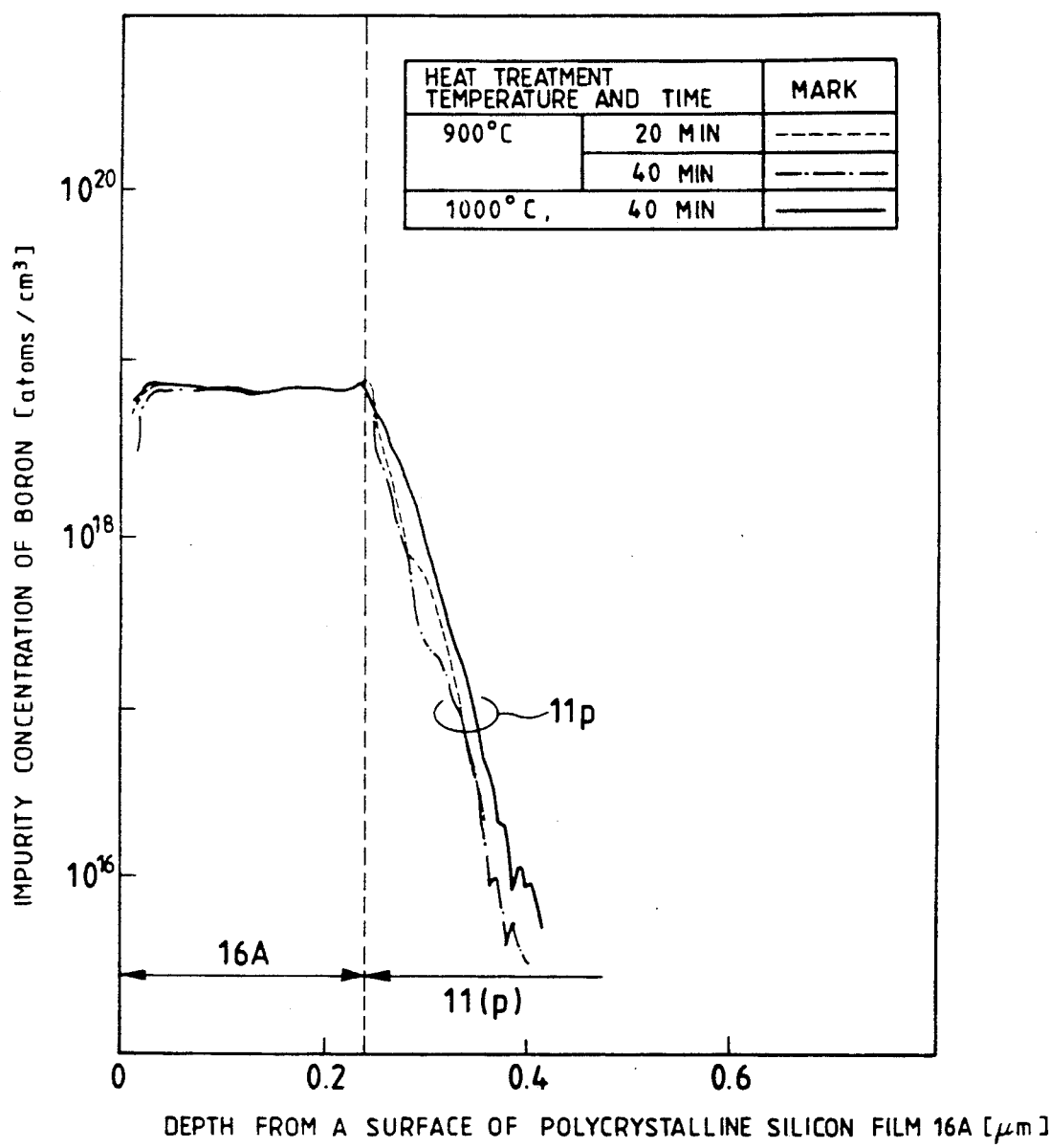
FIG. 24 is an impurity concentration distribution diagram in a certain region of the bipolar transistor of the second embodiment.

FIG. 24 shows how the position in which the p-type impurity 11p is introduced into the main surface of the p-type semiconductor region 11 and the amount of the p-type impurity 11p flowing up into the silicon film 16A from the main surface of the p-type semiconductor region 11 depend on the heat treatment time and temperature. As shown, once the concentration of the p-type impurity 11p introduced into the main surface of the p-type semiconductor region 11 and that of the p-type impurity 11p flowing up into the silicon film 16A reach an equilibrium state, the respective impurity concentration distributions scarcely change even with increasing heat treatment and temperature. As shown in FIG. 24, moreover, the flow-up of the p-type impurity 11p into the silicon film 16A reaches an equilibrium state in an early stage.

Figure 23:
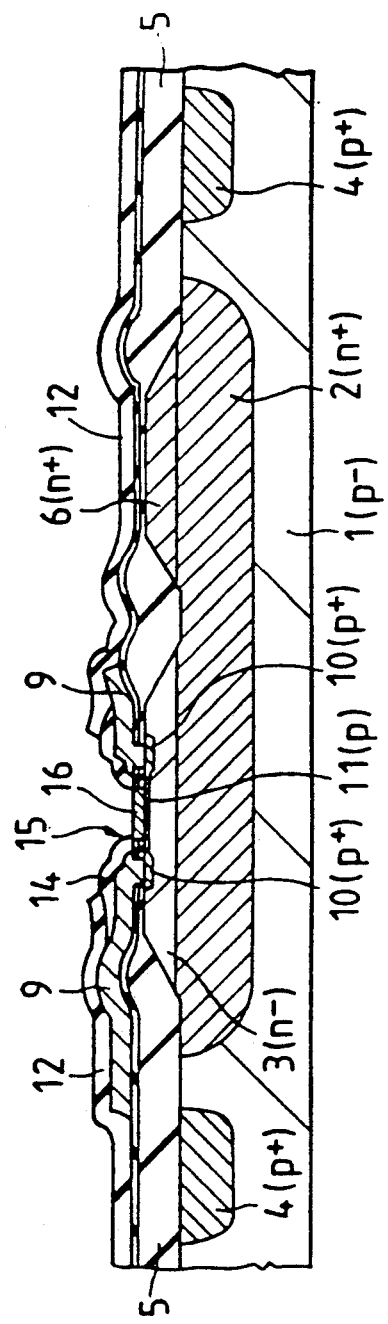

Next, as illustrated in FIG. 23, the silicon film 16A is removed by selective etching using hydrazine, for example, allowing the remaining silicon film 16B to form a silicon film 16 which serves as an impurity diffusion source. The selective etching is performed by utilizing the difference in impurity concentration between the silicon film 16A, which has no p-type impurity introduced therein, and the silicon film 16B, which has the p-type impurity 11p introduced therein.

Thereafter, as explained previously in the first embodiment, the step of introducing the n-type impurity 17n into the silicon film 16 shown in FIG. 16 and the subsequent steps are carried out, whereby the semiconductor integrated circuit device of the second embodiment is completed.

Thus, the silicon film 16 on the main surface of the p-type semiconductor region (intrinsic base region) 11 in the emitter opening 15 is formed by introducing the p-type impurity 11p for etching selectivity into the main surface of the p-type semiconductor region 11 in the area defined by the emitter opening 15, depositing the silicon film 16A on the whole substrate surface including the main surface of the p-type semiconductor region 11 with the p-type impurity 11p introduced therein, allowing the p-type impurity 11p introduced into the main surface of the p-type semiconductor region 11 to flow up into a portion of the silicon film 16A in the emitter opening 15 to form the silicon film 16B of a higher impurity concentration, and removing the silicon film 16A of a lower impurity concentration by etching selectively on the basis of the difference in impurity concentrations between the silicon films 16A and 16B. By this construction there can be obtained the same effect as in the first embodiment.

The present invention has been described concretely in terms of the above embodiments, but the present invention is not limited to those embodiments, and various modifications may be made within the scope not departing from the gist of the invention.

For example, the present invention is applicable to a self-aligned bipolar transistor formed by SST (Super Self-aligned Technology) and is also applicable to a bipolar transistor which adopts SICOS (Side Wall Base Contact Structure). Further, the present invention can be applied to a self-aligned bipolar transistor in which an emitter opening is formed through a side wall spacer in the side wall on the emitter region side of a base lead-out electrode, and an emitter lead-out electrode is connected to the emitter region through the said emitter opening. For example, the said side wall spacer is formed by depositing a silicon oxide film on the surface of the base lead-out electrode by CVD and then by subjecting the silicon oxide film to anisotropic etching to a degree corresponding to the thickness of such deposited film. Thus, the present invention is applicable to all self-aligned bipolar transistors in which a stepped shape corresponding to the film thickness of a base lead-out electrode (and an insulating film for isolation on the surface thereof) is formed in an emitter opening.

The present invention is further applicable to a semiconductor integrated circuit device in which a self-aligned bipolar transistor as explained above and a complementary MISFET are provided on a main surface of a single semiconductor substrate.

What is claimed is:

1. A method of manufacturing a semiconductor integrated circuit device having a bipolar transistor comprising the steps of:
    (a) preparing a semiconductor substrate having a main surface and an emitter-forming region at which an emitter is to be formed;
    (b) forming a base lead-out electrode of said bipolar transistor on said main surface so that said base lead-out electrode surrounds said emitter forming region;
    (c) selectively depositing a first polycrystalline silicon layer on said emitter forming region;
    (d) introducing impurities of a first conductivity type into said first polycrystalline silicon layer;
    (e) after step (d), diffusing said impurities of said first conductivity type from said first polycrystalline silicon layer into said emitter-forming region of said substrate to form a diffused semiconductor layer used as said emitter region of said bipolar transistor; and
    (f) forming a second polycrystalline silicon layer on said first polycrystalline silicon layer so that said first and second polycrystalline silicon layers together form an emitter lead-out electrode of said bipolar transistor.

2. A method of manufacturing a semiconductor integrated circuit device according to claim 1, further comprising a step (g) of forming an insulating film on a side surface of said base lead-out electrode, wherein said base lead-out electrode and said first polycrystalline silicon layer on said emitter forming region are electrically isolated by said insulating film on the side surface of said base lead-out electrode.

3. A method of manufacturing a semiconductor integrated circuit device according to claim 1, wherein step (f) includes a step of patterning said second polycrystalline silicon layer to noncontactingly extend over said base lead-out electrode.

4. A method of manufacturing a semiconductor integrated circuit device according to claim 1, wherein said first polycrystalline silicon layer is deposited by a selective chemical vapor deposition method in step (c).

5. A method of manufacturing a semiconductor integrated circuit device according to claim 1, wherein the impurities introduced in step (d) are introduced by ion implantation at approximately 50–80 KeV energy.

6. A method of manufacturing a semiconductor integrated circuit device according to claim 1, wherein the impurities introduced in step (d) form an impurity concentration peak at a depth of approximately 50 nm from the surface of the first polycrystalline silicon layer.

7. A method of manufacturing a semiconductor integrated circuit device according to claim 2, wherein said substrate further includes a base region in which the emitter region formed in step (e) extends beneath the insulating film to substantially prevent short circuiting between the first polycrystalline silicon layer and the base region.

8. A method of manufacturing a semiconductor integrated circuit device according to claim 7, wherein the base region comprises a graft base region and an intrinsic base region, and wherein the emitter region is formed in the intrinsic base region.

9. A method of manufacturing a semiconductor integrated circuit device according to claim 8, wherein the intrinsic base region is formed before formation of the graft base region.

10. A method of manufacturing a semiconductor integrated circuit device according to claim 1, wherein the bipolar transistor is a vertical transistor.

11. A method of manufacturing a semiconductor integrated circuit device according to claim 1, wherein step (c) is carried out using a source gas at $SiH_2Cl_2:HCl = 1:1$ at approximately 80° C. and 30 torr so that the first polycrystalline silicon layer is of substantially uniform thickness.

12. A method of manufacturing a semiconductor integrated circuit device according to claim 1, wherein the first polycrystalline silicon film is deposited to be approximately 150–250 nm thick.

13. A method of manufacturing a semiconductor integrated circuit device according to claim 1, wherein step
(e) is carried out at a temperature of approximately 900°–1000° C. for approximately 40–50 minutes.

14. A method of manufacturing a semiconductor integrated circuit device having a bipolar transistor with at least a base region, an emitter region formed in said base region and a base lead-out electrode connected to said base region and surrounding said emitter region without overlying said emitter region, comprising the steps of:
(a) preparing a semiconductor substrate having a main surface, including forming said base region in said substrate and said base lead-out electrode surrounding an emitter-forming region on said main surface;
(b) selectively depositing a polycrystalline silicon layer onto the emitter-forming region surrounded by said base lead-out electrode;
(c) introducing impurities of a first conductivity type into said first polycrystalline silicon layer;
(d) after step (c) diffusing said impurities of said first conductivity type into said emitter forming region to form a diffused semiconductor region used as said emitter region of said bipolar transistor; and
(e) forming a second polycrystalline silicon layer on said first polycrystalline silicon layer so that said first and second polycrystalline silicon layers together form an emitter lead-out electrode of said bipolar transistor.

15. A method of manufacturing a semiconductor integrated circuit device according to claim 14, further comprising a step (f) of forming an insulating film on a side surface of said base lead-out electrode, wherein said base lead-out electrode and said first polycrystalline silicon film on said emitter forming region are electrically isolated by said insulating film on the side surface on said base lead-out electrode.

16. A method of manufacturing a semiconductor integrated circuit device according to claim 14, wherein the impurities introduced in step (c) are introduced by ion implantation at approximately 50–80 KeV energy.

17. A method of manufacturing a semiconductor integrated circuit device according to claim 14, wherein the impurities introduced in step (c) form an impurity concentration peak at a depth of approximately 50 nm from the surface of the first polycrystalline silicon layer.

18. A method of manufacturing a semiconductor integrated circuit device according to claim 15, wherein said substrate further includes a base region in which the emitter region formed in step (d) extends beneath the insulating film to substantially prevent short circuiting between the first polycrystalline silicon layer and the base region.

19. A method of manufacturing a semiconductor integrated circuit device according to claim 18, wherein the base region comprises a graft base region and an intrinsic base region, and wherein the emitter region is formed in the intrinsic base region.

20. A method of manufacturing a semiconductor integrated circuit device according to claim 19, wherein the intrinsic base region is formed before formation of the graft base region.

21. A method of manufacturing a semiconductor integrated circuit device according to claim 14, wherein the bipolar transistor is a vertical transistor;

22. A method of manufacturing a semiconductor integrated circuit device according to claim 14, wherein step (b) is carried out using a source gas at $SiH_2Cl_2:HCl = 1:1$ at approximately 800° C. and 30 torr so that the first polycrystalline silicon film is of substantially uniform thickness.

23. A method of manufacturing a semiconductor integrated circuit device according to claim 14, wherein the first polycrystalline silicon film is deposited to be approximately 150–250 nm thick.

24. A method of manufacturing a semiconductor integrated circuit device according to claim 14, wherein step (d) is carried out at a temperature of approximately 900°–1000° C. for approximately 40–60 minutes.

25. A method of manufacturing a semiconductor integrated circuit device according to claim 14, wherein step (e) includes a step of patterning said second polycrystalline silicon layer to noncontactingly extend over said base lead-out electrode.

26. A method of manufacturing a semiconductor integrated circuit device according to claim 14, wherein said first polycrystalline silicon film is deposited by a selective chemical vapor deposition method in step (b).

27. A method of manufacturing a semiconductor integrated circuit device having a bipolar transistor wherein an emitter lead-out electrode is connected to an emitter region to be formed in a main surface of a semiconductor substrate through an emitter opening formed in an area surrounded by side walls of a base lead-out electrode provided on the main surface of the substrate, comprising the steps of:

(a) forming a first silicon film selectively on only the main surface of said substrate in said emitter opening;

(b) introducing an impurity into said first silicon film by diffusion from said main surface;

(c) after step (b) diffusing said impurity into the main surface of the substrate to form a diffused semiconductor region used as said emitter region; and (d) forming a second silicon film on said first silicon film, said first and second silicon films together forming said emitter lead-out electrode.

28. A method of manufacturing a semiconductor integrated circuit device according to claim 27, wherein step (a) includes a step of depositing a silicon film on the main surface of the substrate by a selective CVD method.

29. A method of manufacturing a semiconductor integrated circuit device according to claim 27, wherein step (a) includes a step ($a_1$) of introducing an impurity into the main surface of said substrate in an area defined by said emitter opening, a step ($a_2$) of depositing the first silicon film on the entire surface of the substrate including the main surface of the substrate having said impurity introduced therein, a step ($a_3$) of allowing the impurity which has been introduced into the main surface of said substrate to flow up into a portion of said first silicon film in said emitter opening to make said portion of the first silicon film higher in impurity concentration than in the other portion, and a step ($a_4$) of removing said other portion of lower impurity concentration by etching on the basis of the relative differences in impurity concentrations of the two portions of the first silicon film, leaving said relatively impure portion selectively, said steps ($a_1$-$a_4$) being carried out successively in this order.

30. A method of manufacturing a semiconductor integrated circuit device according to claim 29, wherein step ($a_1$) includes a boron ion introducing step, and said portion of a higher impurity concentration of said silicon film and said other portion of a lower impurity concentration thereof are formed at a difference in boron ion concentration of $10^{19}$ atoms/cm$^3$ or more.

31. A method of manufacturing a semiconductor integrated circuit device according to claim 27, wherein step (a) includes a step of forming the first silicon film at a thickness of 100 to 350 nm.

32. A method of manufacturing a semiconductor integrated circuit device according to claim 27, further comprising a step (e) of forming an insulating film on a side surface of said base lead-out electrode, wherein said base lead-out electrode and said first polycrystalline silicon film on said emitter forming region are electrically isolated by said insulating film on the side surface of said base lead-out electrode.

33. A method of manufacturing a semiconductor integrated circuit device according to claim 27, wherein the impurity introduced in step (b) is $BF_2$ of $1 \times 10^{15}$ to $2 \times 10^{15}$ atoms/cm$^2$ introduced by ion implantation at approximately 30–40 KeV energy.

34. A method of manufacturing a semiconductor integrated circuit device according to claim 27, wherein the first and second silicon films are polycrystalline silicon films.

35. A method of manufacturing a semiconductor integrated circuit device according to claim 27, wherein said substrate further includes a base region in which the emitter region is formed in step (c), and wherein the emitter region extends beneath the insulating film to substantially prevent short circuiting between the first silicon film and the base region.

36. A method of manufacturing a semiconductor integrated circuit device according to claim 34, wherein the base region comprises a graft base region and an intrinsic base region, and wherein the emitter region is formed in the intrinsic base region.

37. A method of manufacturing a semiconductor integrated circuit device according to claim 36, wherein the intrinsic base region is formed before formation of the graft base region.

38. A method of manufacturing a semiconductor integrated circuit device according to claim 27, wherein the bipolar transistor is a vertical transistor.

39. A method of manufacturing a semiconductor integrated circuit device according to claim 27, wherein the first silicon film is formed to be approximately 150-200 nm thick.

40. A method of manufacturing a semiconductor integrated circuit device according to claim 27, wherein step (d) includes a step of patterning said second polycrystalline silicon layer to noncontactingly extend over said base lead-out electrode.

41. A method of manufacturing a semiconductor integrated circuit device according to claim 27, wherein said first silicon film is deposited by a selective chemical vapor deposition method in step (a).

* * * * *